(12) United States Patent
Kim et al.

(10) Patent No.: US 10,212,375 B2
(45) Date of Patent: Feb. 19, 2019

(54) ANALOG-TO-DIGITAL CONVERTERS AND IMAGE SENSOR HAVING THE SAME

(71) Applicant: Samsung Electronics Co., Ltd., Suwon-si, Gyeonggi-do (KR)

(72) Inventors: Moo-Young Kim, Suwon-si (KR); Kwang-Hyun Lee, Seongnam-si (KR); Kyoung-Min Koh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 15/259,510

(22) Filed: Sep. 8, 2016

(65) Prior Publication Data

US 2017/0094213 A1 Mar. 30, 2017

(30) Foreign Application Priority Data

Sep. 25, 2015 (KR) .................. 10-2015-0136021

(51) Int. Cl.
*H04N 5/217* (2011.01)
*H04N 5/3745* (2011.01)
*H03M 1/34* (2006.01)
*H01L 27/146* (2006.01)

(52) U.S. Cl.
CPC ... *H04N 5/37455* (2013.01); *H01L 27/14612* (2013.01); *H01L 27/14641* (2013.01); *H01L 27/14643* (2013.01); *H03M 1/34* (2013.01)

(58) Field of Classification Search
CPC .............................. H04N 5/217; H04N 5/228
USPC .............. 250/208.1, 214 R, 214 A, 214 DC; 348/241
See application file for complete search history.

(56) References Cited

U.S. PATENT DOCUMENTS

| | | | |
|---|---|---|---|
| 7,321,329 B2* | 1/2008 | Tooyama | H03M 1/0607 341/163 |
| 7,595,824 B2 | 9/2009 | Egawa et al. | |
| 8,248,490 B2 | 8/2012 | Zhang et al. | |
| 2002/0070331 A1 | 6/2002 | Inui et al. | |
| 2009/0052775 A1 | 2/2009 | Moon et al. | |
| 2010/0277622 A1 | 11/2010 | Fossum et al. | |
| 2011/0102647 A1 | 5/2011 | Kim et al. | |

FOREIGN PATENT DOCUMENTS

| | | |
|---|---|---|
| EP | 2 796 989 A2 | 10/2014 |
| KR | 10-1999-0068235 A | 8/1999 |
| KR | 10-2009-0020917 A | 2/2009 |
| KR | 10-2010-0118772 A | 11/2010 |
| KR | 10-2011-0048922 A | 5/2011 |
| WO | WO 2008/030327 A2 | 3/2008 |

* cited by examiner

*Primary Examiner* — Kevin Pyo
(74) *Attorney, Agent, or Firm* — Myers Bigel, P.A.

(57) ABSTRACT

An analog-to-digital converter includes a comparator, a switch, and a counter circuit. The comparator is configured to generate a comparison signal by comparing an analog signal received through a first signal line and a reference signal received through a second signal line. The switch is coupled between the first signal line and the comparator. The switch is open before the analog signal is applied to the first signal line to disconnect the first signal line from the comparator, and is closed after the analog signal is applied to the first signal line to provide the analog signal to the comparator. The counter circuit is configured to generate a digital signal corresponding to the analog signal by performing a count operation in synchronization with a count clock signal based on the comparison signal.

20 Claims, 14 Drawing Sheets

TURNED-ON STATE

TURNED-OFF STATE

ANALOG-TO-DIGITAL CONVERTERS AND IMAGE SENSOR HAVING THE SAME

CROSS-REFERENCE TO RELATED APPLICATION(S)

This application claims priority under 35 USC § 119 to Korean Patent Application No. 10-2015-0136021, filed on Sep. 25, 2015 in the Korean Intellectual Property Office (KIPO), the contents of which are herein incorporated by reference in their entirety.

BACKGROUND

1. Technical Field

Example embodiments relate to an image sensor, and more particularly to an analog-to-digital converter that reduces noise and an image sensor including the analog-to-digital converter.

2. Description of the Related Art

Generally, an analog-to-digital converter included in an image sensor is implemented with metal oxide semiconductor (MOS) transistors.

If defects exist in an oxide layer of a MOS transistor, electrons or holes flowing through a channel of the MOS transistor may be trapped in the defects, or electrons or holes trapped in the defects may be de-trapped. Therefore, a magnitude of a current flowing through a channel of a MOS transistor may vary based on an amount of electrons or holes trapped in the defects or de-trapped from the defects, which may cause random telegraph signal (RTS) noise in the MOS transistor.

When RTS noise occurs in an analog-to-digital converter included in an image sensor, performance of the image sensor may be degraded.

SUMMARY

Some example embodiments are directed to provide an analog-to-digital converter that reduces random telegraph signal (RTS) noise.

Some example embodiments are directed to provide an image sensor including the analog-to-digital converter.

According to example embodiments, an analog-to-digital converter includes a comparator, a switch, and a counter circuit. The comparator is configured to generate a comparison signal by comparing an analog signal received through a first signal line and a reference signal received through a second signal line. The switch is coupled between the first signal line and the comparator. The switch is open before the analog signal is applied to the first signal line to disconnect the first signal line from the comparator, and is closed after the analog signal is applied to the first signal line to provide the analog signal to the comparator. The counter circuit is configured to generate a digital signal corresponding to the analog signal by performing a count operation in synchronization with a count clock signal based on the comparison signal.

In example embodiments, the switch may be open during a transient period in which the analog signal is applied to the first signal line such that a voltage of the first signal line is changed, and may be closed after the voltage of the first signal line is stabilized at a voltage corresponding to the analog signal.

In example embodiments, the comparator may include a first coupling capacitor including a first electrode coupled to the switch, a first transistor including a gate coupled to a second electrode of the first coupling capacitor, a second coupling capacitor including a first electrode coupled to the second signal line, and a second transistor including a gate coupled to a second electrode of the second coupling capacitor. The comparator may output the comparison signal through a drain of the first transistor based on a magnitude of a current flowing through the first transistor and a magnitude of a current flowing through the second transistor.

An aspect ratio of the first transistor may be substantially the same as an aspect ratio of the second transistor.

The second transistor may be maintained to be turned on from a time before the analog signal is applied to the first signal line to a time at which the counter circuit outputs the digital signal.

The comparator may further include a current source coupled between a ground voltage and sources of the first transistor and the second transistor, a third transistor coupled between the drain of the first transistor and a supply voltage, the third transistor including a gate coupled to a drain of the second transistor, and a fourth transistor coupled between the drain of the second transistor and the supply voltage, the fourth transistor including a gate coupled to the drain of the second transistor.

In example embodiments, the reference signal may be maintained at a reference level before the switch is closed, and decrease at a constant rate after the switch is closed.

In example embodiments, a first analog signal and a second analog signal may be applied to the first signal line alternately. The switch may be open before the first analog signal is applied to the first signal line to disconnect the first signal line from the comparator and may be closed after the first analog signal is applied to the first signal line to provide the first analog signal to the comparator, the comparator may generate a first comparison signal by comparing the first analog signal and the reference signal, and the counter circuit may generate a first count value corresponding to the first analog signal by performing a count operation in synchronization with the count clock signal until a logic level of the first comparison signal is changed. The switch may be open before the second analog signal is applied to the first signal line to disconnect the first signal line from the comparator and may be closed after the second analog signal is applied to the first signal line to provide the second analog signal to the comparator, the comparator may generate a second comparison signal by comparing the second analog signal and the reference signal, and the counter circuit may generate a second count value corresponding to the second analog signal by performing a count operation in synchronization with the count clock signal until a logic level of the second comparison signal is changed and output a difference between the first count value and the second count value as the digital signal.

According to example embodiments, an image sensor includes a pixel array, a reference signal generation circuit, and an analog-to-digital converter. The pixel array includes a plurality of pixels, each of which generates an analog signal in response to incident light. The reference signal generation circuit generates a reference signal changing at a constant rate. The analog-to-digital converter generates a digital signal corresponding to the analog signal. The analog-to-digital converter includes a comparator, a switch, and a counter circuit. The comparator generates a comparison signal by comparing the analog signal and the reference signal. The switch is coupled between the pixel array and the comparator. The switch is open before the pixel array outputs the analog signal to disconnect the pixel array from the comparator, and is closed after the pixel array outputs the analog signal to provide the analog signal to the comparator. The counter circuit generates the digital signal by performing a count operation in synchronization with a count clock signal based on the comparison signal.

In example embodiments, each of the plurality of pixels may alternately generate a first analog signal corresponding to a reset component and a second analog signal corresponding to the incident light. The switch may be open before each of the plurality of pixels outputs the first analog signal and may be closed after each of the plurality of pixels outputs the first analog signal. The switch may be open before each of the plurality of pixels outputs the second analog signal and may be closed after each of the plurality of pixels outputs the second analog signal.

In example embodiments, each of the plurality of pixels may include a photoelectric conversion element configured to generate photo-charges in response to the incident light, a transmission transistor including a source storing the photo-charges generated by the photoelectric conversion element, a drain coupled to a floating diffusion region, and a gate configured to receive a transmission control signal, a reset transistor including a source coupled to the floating diffusion region, a drain coupled to a supply voltage, and a gate configured to receive a reset control signal, a drive transistor including a source, a drain coupled to the supply voltage, and a gate coupled to the floating diffusion region, and a row selection transistor including a drain coupled to the source of the drive transistor, a gate configured to receive a row selection signal, and a source configured to output the analog signal.

The switch may be open during a first time period including a second time period in which the reset control signal is activated, and may be closed after the first time period. The switch may be open during a third time period including a fourth time period in which the transmission control signal is activated, and may be closed after the third time period.

The reference signal may be maintained at a reference level while the switch is open, and decrease at a constant rate from the reference level after the switch is closed.

In example embodiments, the comparator may include a first coupling capacitor including a first electrode coupled to the switch, a first transistor including a gate coupled to a second electrode of the first coupling capacitor, a second coupling capacitor including a first electrode configured to receive the reference signal, and a second transistor including a gate coupled to a second electrode of the second coupling capacitor. The comparator may output the comparison signal through a drain of the first transistor based on a magnitude of a current flowing through the first transistor and a magnitude of a current flowing through the second transistor.

The second transistor may be maintained to be turned on from a time before each of the plurality of pixels outputs the analog signal to a time at which the counter circuit outputs the digital signal.

According to example embodiments, an analog-to-digital converter comprises a comparator circuit comprising a differential pair of transistors, a first one of the pair of transistors being coupled to a reference signal and a second one of the pair of transistors being coupled to an input analog signal via a switch, the switch being configured in an open state to disconnect the input analog signal from the second one of the pair of transistors responsive to receiving the input analog signal and being configured in a closed state to connect the input analog signal to the second one of the pair of transistors responsive to a transient time period having elapsed after receiving the input analog signal at the switch, the comparator circuit being configured to generate an output signal based on the input analog signal and the reference signal; and a counter circuit that is configured to generate a digital signal responsive to the output signal of the comparator circuit.

In example embodiments, the input analog signal has a substantially constant magnitude after the transient time period has elapsed.

In example embodiments, a magnitude of the reference signal is changed at a known rate beginning at a start count time responsive to the switch being configured in the closed state; and the output signal of the comparator circuit transitions from a first logic state to a second logic state at a stop count time responsive to the magnitude of the reference signal and the magnitude of the input analog signal are approximately equal.

In example embodiments, the counter circuit is configured to generate the digital signal based on a time difference between the stop count time and the start count time.

In example embodiments, the first one of the pair of transistors is maintained in an on state during the transient time period.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
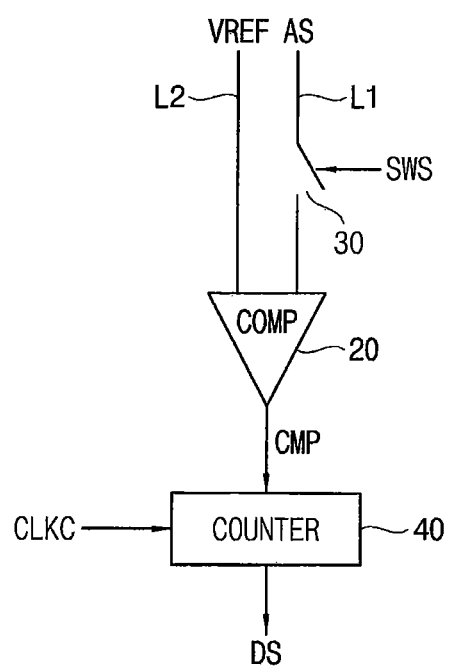
FIG. 1 is a block diagram illustrating an analog-to-digital converter according to some embodiments of the inventive concept.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a block diagram illustrating an analog-to-digital converter according to example embodiments of the inventive concept.

Referring to FIG. 1, an analog-to-digital converter 10 includes a comparator COMP 20, a switch 30, and a counter circuit 40.

The analog-to-digital converter 10 may receive an analog signal AS through a first signal line L1 and receive a reference signal VREF through a second signal line L2.

The comparator 20 may generate a comparison signal CMP by comparing the analog signal AS received through the first signal line L1 and the reference signal VREF received through the second signal line L2. For example, the comparator 20 may generate the comparison signal CMP having a first logic level when a magnitude of the analog signal AS is less than a magnitude of the reference signal VREF, and generate the comparison signal CMP having a second logic level when the magnitude of the analog signal AS is greater than or equal to the magnitude of the reference signal VREF. In some example embodiments, the first logic level may be a logic high level, and the second logic level may be a logic low level.

The switch 30 may be coupled between the first signal line L1 and the comparator 20. The switch 30 may be turned on in response to a switch control signal SWS. The switch 30 may be turned off before the analog signal AS is applied to the first signal line L1 to disconnect the first signal line L1 from the comparator 20, and be turned on after the analog signal AS is applied to the first signal line L1 to provide the analog signal AS to the comparator 20.

In some example embodiments, the reference signal VREF may correspond to a ramp signal, which is maintained at a reference level before the switch 30 is turned on and decreases at a constant rate after the switch 30 is turned on. Therefore, a time difference between a time at which the reference signal VREF starts to decrease and a time at which the comparison signal CMP transitions from the first logic level to the second logic level may be proportional to a magnitude of the analog signal AS. In some example embodiments, the reference level may correspond to a voltage level of a supply voltage VDD.

The counter circuit 40 may generate a digital signal DS based on the analog signal AS by performing a count operation in synchronization with a count clock signal CLKC based on the comparison signal CMP. For example, the counter circuit 40 may perform the count operation in synchronization with the count clock signal CLKC to generate a count value while the comparison signal CMP has the first logic level, and stop performing the count operation and output the count value as the digital signal DS when the comparison signal CMP transitions from the first logic level to the second logic level. Therefore, the counter circuit 40 may generate the digital signal DS having a value proportional to the magnitude of the analog signal AS.

When the analog signal AS is applied to the first signal line L1 by an external device, a voltage of the first signal line L1 may change during a transient period and then stabilize at a voltage level corresponding to the analog signal AS. As will be described below, if the first signal line L1 is connected to the comparator 20 during the transient period, the voltage of the first signal line L1 in a transient state may be provided to the comparator 20, such that an accuracy of the comparator 20 may decrease. In this case, noise may be included in the digital signal DS output by the analog-to-digital converter 10.

However, the switch 30 included in the analog-to-digital converter 10 according to example embodiments may be opened during the transient period, in which the analog signal AS is applied to the first signal line L1 such that the voltage of the first signal line L1 is changed, to disconnect the first signal line L1 from the comparator 20, and may be closed after the voltage of the first signal line L1 is stabilized at a voltage level corresponding to the analog signal AS to connect the first signal line L1 to the comparator 20. Therefore, a performance of the analog-to-digital converter 10 may be effectively increased.

Figure 2:
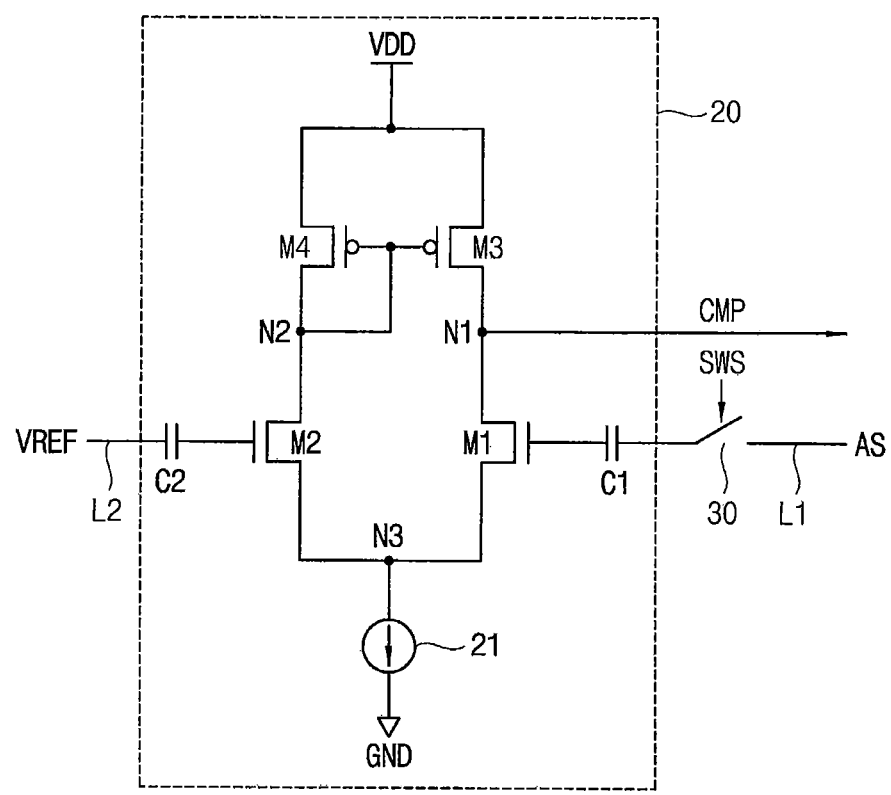
FIG. 2 is a circuit diagram illustrating a comparator included in the analog-to-digital converter of FIG. 1 according to some embodiments of the inventive concept.

FIG. 2 is a circuit diagram illustrating an example of a comparator included in the analog-to-digital converter of FIG. 1 according to some embodiments of the inventive concept.

Referring to FIG. 2, the comparator 20 may include a first coupling capacitor C1, a second coupling capacitor C2, a first transistor M1, a second transistor M2, a third transistor M3, a fourth transistor M4, and a current source 21.

The first coupling capacitor C1 may be coupled between the switch 30 and a gate of the first transistor M1. When the switch 30 is turned on, the first coupling capacitor C1 may receive the analog signal AS through the first signal line L1, and provide an alternating current (AC) component of the analog signal AS to the gate of the first transistor M1 by eliminating a direct current (DC) component of the analog signal AS. That is, the first coupling capacitor C1 may provide a voltage corresponding to a change of the magnitude of the analog signal AS to the gate of the first transistor M1 through a coupling effect.

The second coupling capacitor C2 may be coupled between the second signal line L2 and a gate of the second transistor M2. The second coupling capacitor C2 may receive the reference signal VREF through the second signal line L2, and provide an AC component of the reference signal VREF to the gate of the second transistor M2 by eliminating a DC component of the reference signal VREF. That is, the second coupling capacitor C2 may provide a voltage corresponding to a change of the magnitude of the reference signal VREF to the gate of the second transistor M2 through a coupling effect.

The first transistor M1 may include a drain coupled to a first node N1, a source coupled to a third node N3, and the gate coupled to the first coupling capacitor C1.

The second transistor M2 may include a drain coupled to a second node N2, a source coupled to the third node N3, and the gate coupled to the second coupling capacitor C2.

The third transistor M3 may include a drain coupled to the first node N1, a source coupled to the supply voltage VDD, and a gate coupled to the second node N2.

The fourth transistor M4 may include a drain coupled to the second node N2, a source coupled to the supply voltage VDD, and a gate coupled to the second node N2.

The current source 21 may be coupled between the third node N3 and a ground voltage GND. The current source 21 may flow a current having a constant magnitude from the third node N3 to the ground voltage GND.

In some example embodiments, each of the first transistor M1 and the second transistor M2 may be an n-type metal oxide semiconductor (NMOS) transistor, and each of the third transistor M3 and the fourth transistor M4 may be a p-type metal oxide semiconductor (PMOS) transistor.

In some example embodiments, an aspect ratio (W/L) of the first transistor M1 may be substantially the same as an aspect ratio (W/L) of the second transistor M2.

Therefore, when a magnitude of a voltage applied to the gate of the first transistor M1 is the same as a magnitude of a voltage applied to the gate of the second transistor M2, the first transistor M1 and the second transistor M2 may flow a current having the same magnitude.

When a magnitude of a voltage applied to the gate of the first transistor M1 is greater than a magnitude of a voltage applied to the gate of the second transistor M2, the first transistor M1 may be turned on more strongly than the second transistor M2 such that a magnitude of a current flowing through the first transistor M1 may be greater than a magnitude of a current flowing through the second transistor M2. In this case, the comparator 20 may output the comparison signal CMP having a logic low level through the first node N1, which corresponds to the drain of the first transistor M1.

On the other hand, when a magnitude of a voltage applied to the gate of the second transistor M2 is greater than a magnitude of a voltage applied to the gate of the first transistor M1, the second transistor M2 may be turned on more strongly than the first transistor M1 such that a magnitude of a current flowing through the second transistor M2 may be greater than a magnitude of a current flowing through the first transistor M1. In this case, the comparator 20 may output the comparison signal CMP having a logic high level through the first node N1, which corresponds to the drain of the first transistor M1.

As described above, the comparator 20 may output the comparison signal CMP through the first node N1, which corresponds to the drain of the first transistor M1, based on a magnitude of a current flowing through the first transistor M1 and a magnitude of a current flowing through the second transistor M2.

Figure 3:
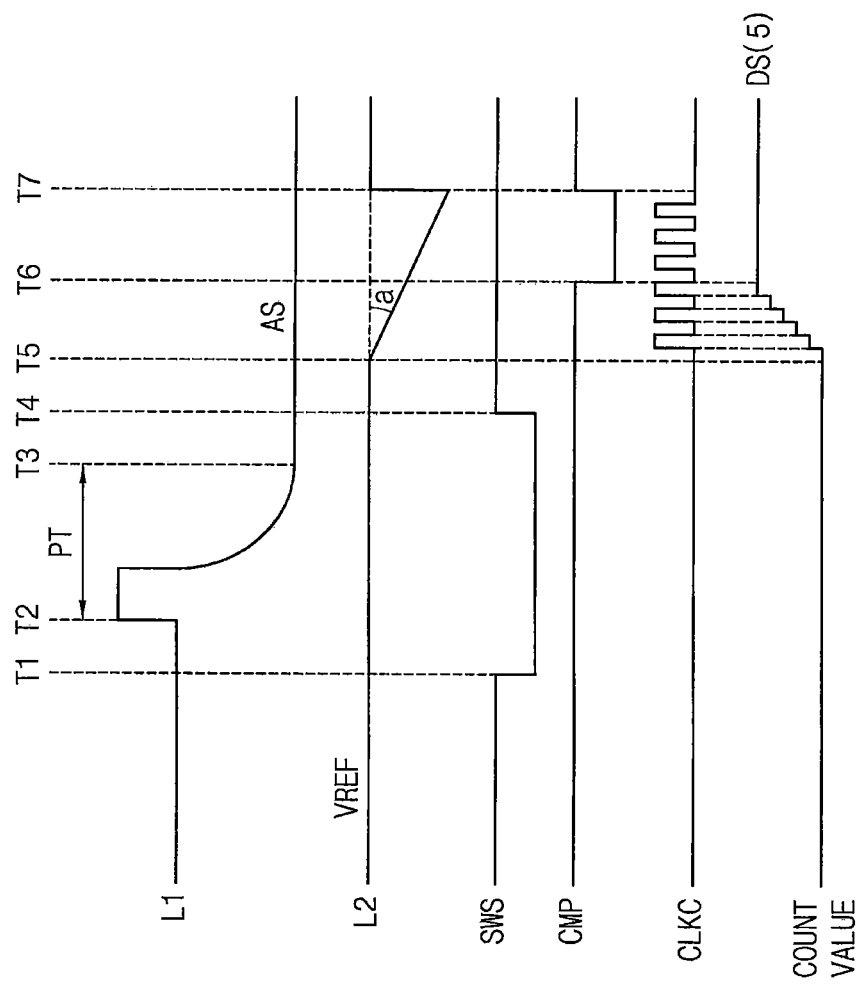
FIG. 3 is a timing diagram illustrating example operations of the analog-to-digital converter of FIG. 1 according to some embodiments of the inventive concept.

FIG. 3 is a timing diagram illustrating example operations of the analog-to-digital converter of FIG. 1 according to some embodiments of the inventive concept.

Hereinafter, example operations of the analog-to-digital converter 10 will be described with reference to FIGS. 1 to 3.

Before a first time T1, the switch 30 may be maintained to be turned on in response to the switch control signal SWS having a logic high level. Therefore, the first transistor M1 may be turned on based on a voltage of the first signal line L1. In addition, because the reference signal VREF, which is applied to the second signal line L2, is maintained at the reference level, the second transistor M2 may be turned on based on the reference signal VREF.

At the first time T1, the switch control signal SWS may transition to a logic low level, such that the switch 30 may be turned off. Therefore, the first coupling capacitor C1 may be disconnected from the first signal line L1.

At a second time T2, the analog signal AS may be applied to the first signal line L1. When the analog signal AS is applied to the first signal line L1, the voltage of the first signal line L1 may change during the transient period PT and then stabilize at a voltage corresponding to the analog signal AS at a third time T3. In some example embodiments, as illustrated in FIG. 3, the voltage of the first signal line L1 may increase temporarily during the transient period PT and then stabilize at the voltage corresponding to the analog signal AS. However, the change of the voltage of the first signal line L1 during the transient period PT illustrated in FIG. 3 is only an example. The voltage of the first signal line L1 may change in various forms during the transient period PT according to the manner in which the analog signal AS is applied to the first signal line L1.

At a fourth time T4, which is after the voltage of the first signal line L1 is stabilized at the voltage corresponding to the analog signal AS, the switch control signal SWS may transition to a logic high level, such that the switch 30 may be closed. Therefore, the voltage corresponding to the analog signal AS may be applied to the gate of the first transistor M1 at the fourth time T4.

As illustrated in FIG. 3, because the switch 30 is open from the first time T1 to the fourth time T4, which includes the transient period PT, in response to the switch control signal SWS, the first coupling capacitor C1 may be disconnected from the first signal line L1 during the transient period PT. Therefore, a voltage applied to the gate of the first transistor M1 may be constantly maintained although the voltage of the first signal line L1 is changed during the transient period PT.

Because the reference signal VREF, which is applied to the second signal line L2, is maintained at the reference level corresponding to the supply voltage VDD until a fifth time T5, the comparator 20 may output the comparison signal CMP having a logic high level.

At the fifth time T5, the reference signal VREF may start to decrease at a constant rate having a slope of 'a'. As illustrated in FIG. 3, the count clock signal CLKC may be toggled only while the reference signal VREF decreases at the constant rate a. Therefore, the counter circuit 40 may start to perform a count operation in synchronization with the count clock signal CLKC at the fifth time T5.

At a sixth time T6, a voltage level of the reference signal VREF may become equal to a voltage level of the analog signal AS, such that the comparator 20 may transition the comparison signal CMP to a logic low level. Therefore, the counter circuit 40 may stop performing the count operation at the sixth time T6 and output the count value as the digital signal DS. FIG. 3 represents that the counter circuit 40 performs the count operation five times from the fifth time T5 to the sixth time T6, and outputs the digital signal DS having a value of "5" at the sixth time T6.

At a seventh time T7, the reference signal VREF, which is applied to the second signal line L2, may return to the reference level, and the analog-to-digital converter 10 may finish the analog-to-digital conversion operation.

Figure 4A:
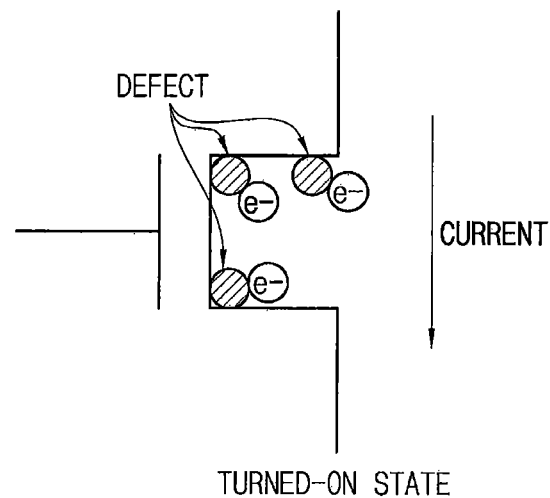
FIGS. 4A and 4B are diagrams random telegraph signal (RTS) noise occurring in a metal oxide semiconductor (MOS) transistor.
Figure 4B:
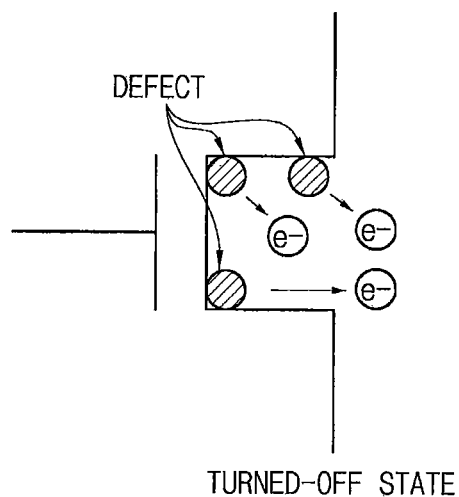

FIGS. 4A and 4B are diagrams illustrating random telegraph signal (RTS) noise occurring in a metal oxide semiconductor (MOS) transistor.

Referring to FIBS. 4A and 4B, defects may exist in an oxide layer of a MOS transistor. Therefore, as illustrated in FIG. 4A, when the MOS transistor is turned on, electrons (or holes) flowing through a channel of the MOS transistor may be trapped in the defects. In addition, as illustrated in FIG. 4B, when the MOS transistor is turned off, electrons (or holes) trapped in the defects may be de-trapped.

The number of defects in the oxide layer of the MOS transistor may be variable according to a manufacturing process of the MOS transistor.

Therefore, at an initial stage of turning on the MOS transistor, a magnitude of a current flowing through a channel of the MOS transistor may vary based on an amount of electrons (or holes) trapped in the defects, which occurs as RTS noise in the MOS transistor.

After the MOS transistor is maintained to be turned on such that electrons (or holes) are trapped in all of the defects of the MOS transistor, the magnitude of the current flowing through the channel of the MOS transistor may be constant based on a voltage applied to a gate of the MOS transistor.

If the first signal line L1 is connected to the first coupling capacitor C1 during the transient period PT and the voltage of the first signal line L1 is increased temporarily during the transient period PT, the first transistor M1 may be turned on more strongly, such that the second transistor M2 may be turned off temporarily and then be turned on again. In this case, RTS noise may occur in the second transistor M2 and an accuracy of the comparator 20 may decrease. Therefore, a performance of the analog-to-digital converter 10 may be degraded.

However, as illustrated in FIG. 3, because the switch 30 is open from the first time T1 to the fourth time T4, which includes the transient period PT, in response to the switch control signal SWS, the first coupling capacitor C1 may be disconnected from the first signal line L1 during the transient period PT. Therefore, although the voltage of the first signal line L1 is changed during the transient period PT, a voltage applied to the gate of the first transistor M1 may be maintained constantly, such that the second transistor M2 may be maintained to be turned on. That is, the second transistor M2 may be maintained to be turned on from the first time T1, which is before the analog signal AS is applied to the first signal line L1, to the seventh time T7, which is after the counter circuit 40 outputs the digital signal DS.

Therefore, RTS noise included in the digital signal DS may decrease. As such, performance of the analog-to-digital converter 10 may be effectively increased.

Figure 5:
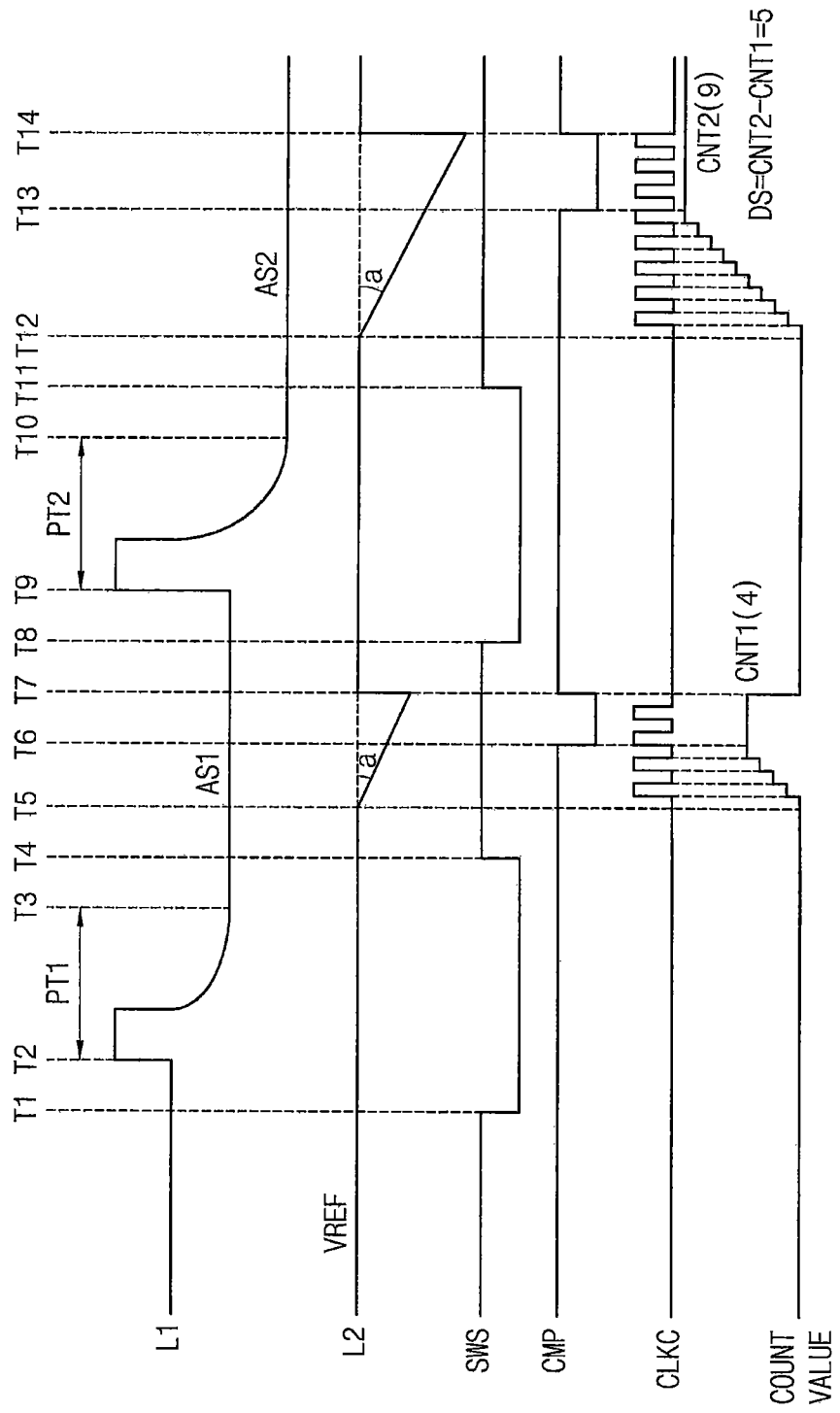
FIGS. 5 and 6 are timing diagrams illustrating example operations of the analog-to-digital converter of FIG. 1 according to some embodiments of the inventive concept.

FIG. 5 is a timing diagram illustrating an example of operations of the analog-to-digital converter of FIG. 1 according to some embodiments of the inventive concept.

FIG. 5 illustrates operations of the analog-to-digital converter 10 in which the analog-to-digital converter 10 alternately receives a first analog signal AS1 and a second analog signal AS2 through the first signal line L1 and generates the digital signal DS corresponding to a difference between the first analog signal AS1 and the second analog signal AS2.

In some example embodiments, the first analog signal AS1 may represent a reset component, and the second analog signal AS2 may represent a detected physical quantity. Therefore, the analog-to-digital converter 10 may generate the digital signal DS, which is proportional to the difference between the first analog signal AS1 and the second analog signal AS2, by performing a correlated double sampling (CDS) operation on the first analog signal AS1 and the second analog signal AS2.

Hereinafter, an example of operations of the analog-to-digital converter 10 will be described with reference to FIGS. 1, 2 and 5.

Before a first time T1, the switch 30 may be maintained to be turned on in response to the switch control signal SWS having a logic high level. Therefore, the first transistor M1 may be turned on based on a voltage of the first signal line L1. In addition, since the reference signal VREF, which is applied to the second signal line L2, is maintained at the reference level, the second transistor M2 may be turned on based on the reference signal VREF.

At the first time T1, the switch control signal SWS may transition to a logic low level, such that the switch 30 may be open. Therefore, the first coupling capacitor C1 may be disconnected from the first signal line L1.

At a second time T2, the first analog signal AS1 may be applied to the first signal line L1. When the first analog signal AS1 is applied to the first signal line L1, the voltage of the first signal line L1 may change during a first transient period PT1 and then stabilize at a voltage corresponding to the first analog signal AS1 at a third time T3. In some example embodiments, as illustrated in FIG. 5, the voltage of the first signal line L1 may increase temporarily during the first transient period PT1 and then stabilize at the voltage corresponding to the first analog signal AS1. However, the change of the voltage of the first signal line L1 during the first transient period PT1 illustrated in FIG. 5 is only an example. The voltage of the first signal line L1 may change in various forms during the first transient period PT1 according to the manner in which the first analog signal AS1 is applied to the first signal line L1.

At a fourth time T4, which is after the voltage of the first signal line L1 stabilizes at the voltage corresponding to the first analog signal AS1, the switch control signal SWS may transition to a logic high level, such that the switch 30 may close. Therefore, the voltage corresponding to the first analog signal AS1 may be applied to the gate of the first transistor M1 at the fourth time T4.

As illustrated in FIG. 5, because the switch 30 is open from the first time T1 to the fourth time T4, which includes the first transient period PT1, in response to the switch control signal SWS, the first coupling capacitor C1 may be disconnected from the first signal line L1 during the first transient period PT1. Therefore, a voltage applied to the gate of the first transistor M1 may be maintained constantly although the voltage of the first signal line L1 changes during the first transient period PT1.

Because the reference signal VREF, which is applied to the second signal line L2, is maintained at the reference level corresponding to the supply voltage VDD until a fifth time T5, the comparator 20 may output the comparison signal CMP having a logic high level.

At the fifth time T5, the reference signal VREF may start to decrease at a constant rate a. As illustrated in FIG. 5, the count clock signal CLKC may be toggled only while the reference signal VREF decreases at the constant rate a. Therefore, the counter circuit 40 may start to perform a count operation in synchronization with the count clock signal CLKC at the fifth time T5.

At a sixth time T6, a voltage level of the reference signal VREF may become equal to a voltage level of the first analog signal AS1, such that the comparator 20 may transition the comparison signal CMP to a logic low level. Therefore, the counter circuit 40 may stop performing the count operation at the sixth time T6 and generate a first count value CNT1 corresponding to the first analog signal AS1. FIG. 5 represents that the counter circuit 40 performs the count operation four times from the fifth time T5 to the sixth time T6, and generates the first count value CNT1 having a value of "4" at the sixth time T6.

At a seventh time T7, the reference signal VREF, which is applied to the second signal line L2, may return to the reference level, and the comparator 20 may output the comparison signal CMP having a logic high level.

At an eighth time T8, the switch control signal SWS may transition to a logic low level, such that the switch 30 may be turned off. Therefore, the first coupling capacitor C1 may be disconnected from the first signal line L1.

At a ninth time T9, the second analog signal AS2 may be applied to the first signal line L1. When the second analog signal AS2 is applied to the first signal line L1, the voltage of the first signal line L1 may change during a second transient period PT2 and then stabilize at a voltage corresponding to the second analog signal AS2 at a tenth time T10. In some example embodiments, as illustrated in FIG. 5, the voltage of the first signal line L1 may increase temporarily during the second transient period PT2 and then stabilize at the voltage corresponding to the second analog signal AS2. However, the change of the voltage of the first signal line L1 during the second transient period PT2 illustrated in FIG. 5 is only an example. The voltage of the first signal line L1 may change in various forms during the second transient period PT2 according to the manner in which the second analog signal AS2 is applied to the first signal line L1.

At an eleventh time T11, which is after the voltage of the first signal line L1 stabilizes at the voltage corresponding to the second analog signal AS2, the switch control signal SWS may transition to a logic high level, such that the switch 30 may close. Therefore, the voltage corresponding to the second analog signal AS2 may be applied to the gate of the first transistor M1 at the eleventh time T11.

As illustrated in FIG. 5, because the switch 30 is open from the eighth time T8 to the eleventh time T11, which includes the second transient period PT2, in response to the switch control signal SWS, the first coupling capacitor C1 may be disconnected from the first signal line L1 during the second transient period PT2. Therefore, a voltage applied to the gate of the first transistor M1 may be maintained constantly although the voltage of the first signal line L1 changes during the second transient period PT2.

Because the reference signal VREF, which is applied to the second signal line L2, is maintained at the reference level corresponding to the supply voltage VDD until a twelfth time T12, the comparator 20 may output the comparison signal CMP having a logic high level.

At the twelfth time T12, the reference signal VREF may start to decrease at the constant rate a. As illustrated in FIG. 5, the count clock signal CLKC may be toggled only while the reference signal VREF decreases at the constant rate a. Therefore, the counter circuit 40 may start to perform a count operation in synchronization with the count clock signal CLKC at the twelfth time T12.

At a thirteenth time T13, a voltage level of the reference signal VREF may become equal to a voltage level of the second analog signal AS2, such that the comparator 20 may transition the comparison signal CMP to a logic low level. Therefore, the counter circuit 40 may stop performing the count operation at the thirteenth time T13 and generate a second count value CNT2 corresponding to the second analog signal AS2. FIG. 5 represents that the counter circuit 40 performs the count operation nine times from the twelfth time T12 to the thirteenth time T13, and generates the second count value CNT2 having a value of "9" at the thirteenth time T13. The counter circuit 40 may output a difference between the first count value CNT1 and the second count value CNT2 as the digital signal DS.

At a fourteenth time T14, the reference signal VREF, which is applied to the second signal line L2, may return to the reference level, and the analog-to-digital converter 10 may finish the analog-to-digital conversion operation.

Figure 6:
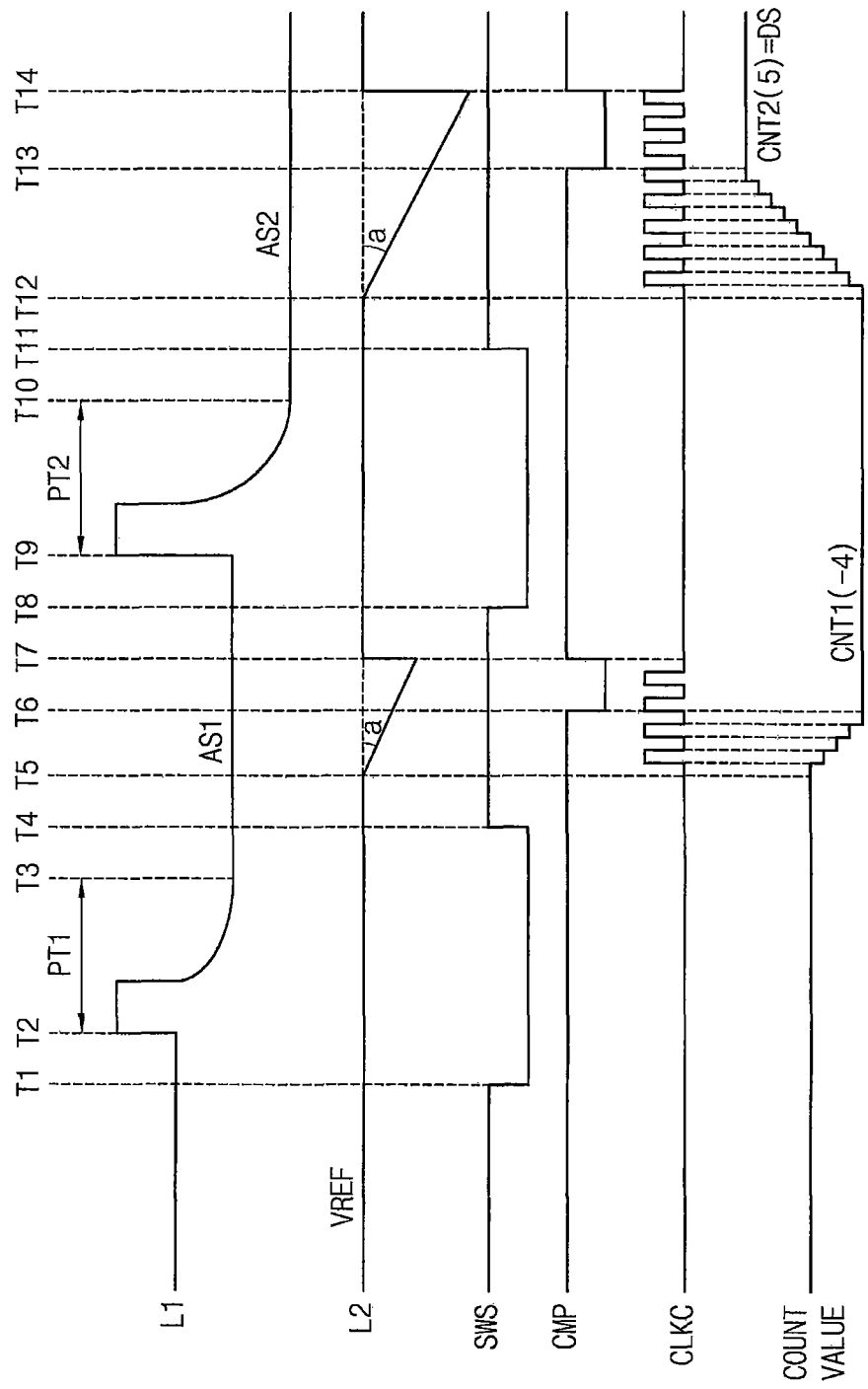

FIG. 6 is a timing diagram illustrating a further example of operations of the analog-to-digital converter of FIG. 1 according to some embodiments of the inventive concept.

The timing diagram of FIG. 6 is the same as the timing diagram of FIG. 5 except for operation of the counter circuit 40 included in the analog-to-digital converter 10. Therefore, duplicated description will be omitted and only the operation of the counter circuit 40 will be described.

In the timing diagram of FIG. 5, the counter circuit 40 generates the first count value CNT1 and the second count value CNT2 separately, and then outputs the difference between the first count value CNT1 and the second count value CNT2 as the digital signal DS.

On the other hand, in the timing diagram of FIG. 6, the counter circuit 40 may generate the first count value CNT1 by performing a down-count operation while the first analog signal AS1 is applied to the first signal line L1, and generate the second count value CNT2 by performing an up-count operation starting from the first count value CNT1 while the second analog signal AS2 is applied to the first signal line L1. In this case, the counter circuit 40 may output the second count value CNT2 as the digital signal DS after the counter circuit 40 stops performing the up-count operation at the thirteenth time T13.

As described above with reference to FIGS. 1 to 6, because the second transistor M2 included in the analog-to-digital converter 10 is maintained to be turned on while performing the analog-to-digital conversion operation, RTS noise occurring in the second transistor M2 may decrease. Therefore, the analog-to-digital converter 10 may perform the CDS operation and the analog-to-digital conversion operation on the first analog signal AS1 and the second analog signal AS2 more accurately.

Figure 7:
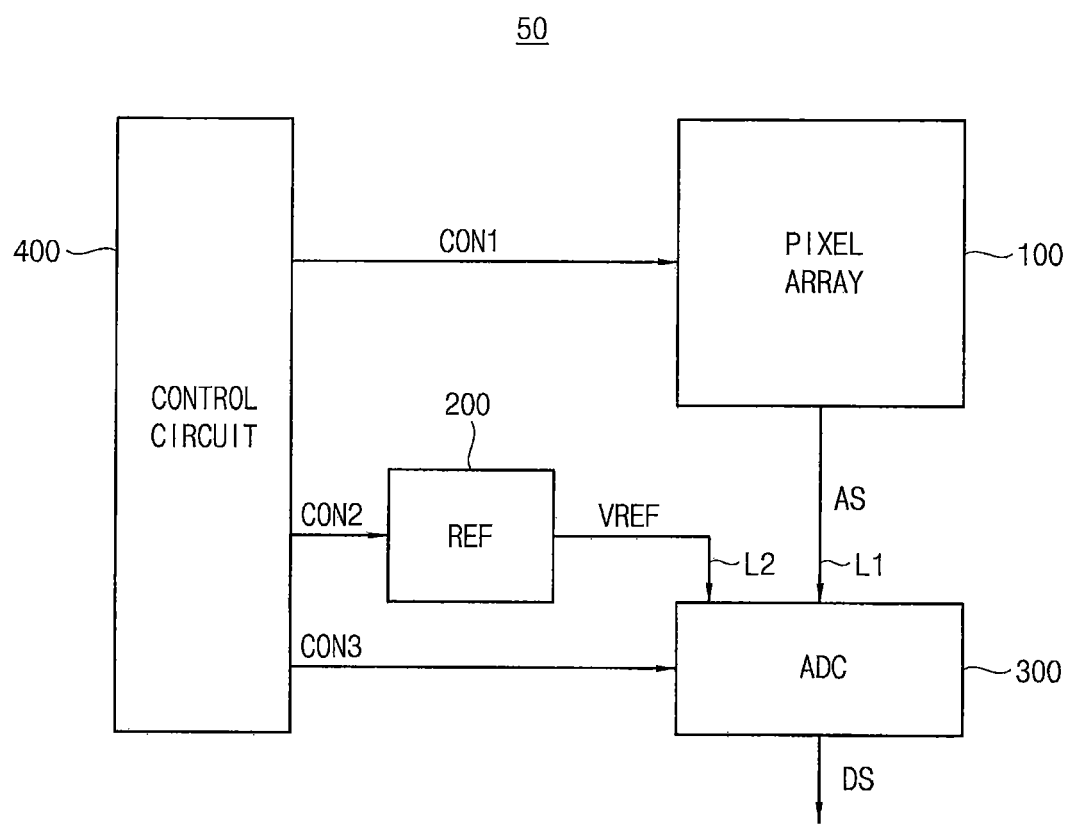
FIG. 7 is a block diagram illustrating an image sensor according to some embodiments of the inventive concept.

FIG. 7 is a block diagram illustrating an image sensor according to example embodiments of the inventive concept.

Referring to FIG. 7, an image sensor 50 includes a pixel array 100, a reference signal generation circuit REF 200, an analog-to-digital conversion circuit ADC 300, and a control circuit 400.

The pixel array 100 includes a plurality of pixels arranged in rows and columns. Each of the plurality of pixels included in the pixel array 100 may detect incident light and generate an analog signal AS in response to the incident light.

The reference signal generation circuit 200 may generate a reference signal VREF, which changes at a constant rate.

The analog-to-digital conversion circuit 300 may receive the analog signal AS from the pixel array 100 through a first signal line L1 and receive the reference signal VREF from the reference signal generation circuit 200 through a second signal line L2. The analog-to-digital conversion circuit 300 may generate a digital signal DS by performing an analog-to-digital conversion operation on the analog signal AS using the reference signal VREF.

The control circuit 400 may control an operation of the pixel array 100 using a first control signal CON1, control an operation of the reference signal generation circuit 200 using a second control signal CON2, and control an operation of the analog-to-digital conversion circuit 300 using a third control signal CON3.

As will be described below, the analog-to-digital conversion circuit 300 may, based on the third control signal CON3, disconnect a connection to the first signal line L1 during a transient period, in which the pixel array 100 outputs the analog signal AS through the first signal line L1 such that a voltage of the first signal line L1 changes, connect to the first signal line L1 to receive the analog signal AS through the first signal line L1 after the voltage of the first signal line L1 stabilizes at a voltage level corresponding to the analog signal AS, and generate the digital signal DS by performing an analog-to-digital conversion operation on the analog signal AS.

Figure 8:
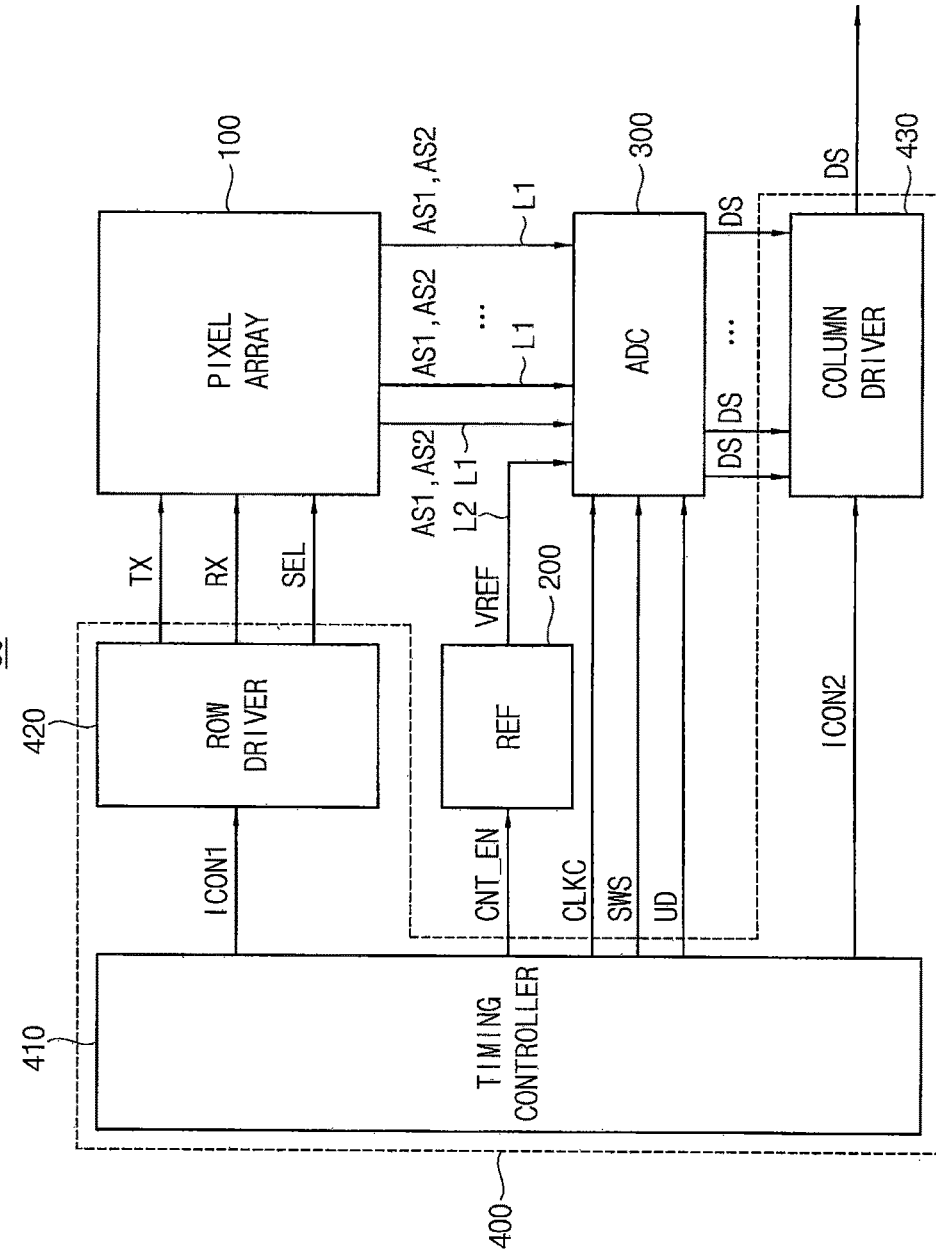
FIG. 8 is a block diagram illustrating an example of the image sensor of FIG. 7 according to some embodiments of the inventive concept.

FIG. 8 is a block diagram illustrating an example of the image sensor of FIG. 7 according to some embodiments of the inventive concept.

Referring to FIG. 8, the image sensor 50 may include a pixel array 100, a reference signal generation circuit REF 200, an analog-to-digital conversion circuit ADC 300, and a control circuit 400. The control circuit 400 may include a timing controller 410, a row driver 420, and a column driver 430.

The timing controller 410 may provide a first inner control signal ICON1 to the row driver 420, and the row driver 420 may control an operation of the pixel array 100 in a unit of a row in response to the first inner control signal ICON1. For example, the row driver 420 may control the operation of the pixel array 100 in a unit of a row by providing a row selection signal SEL, a reset control signal RX and a transmission control signal TX to the pixel array 100.

Each of the plurality of pixels included in the pixel array 100 may alternately generate a first analog signal AS1 corresponding to a reset component and a second analog signal AS2 corresponding to the incident light based on the row selection signal SEL, the reset control signal RX and the transmission control signal TX received from the row driver 420.

Figure 9:
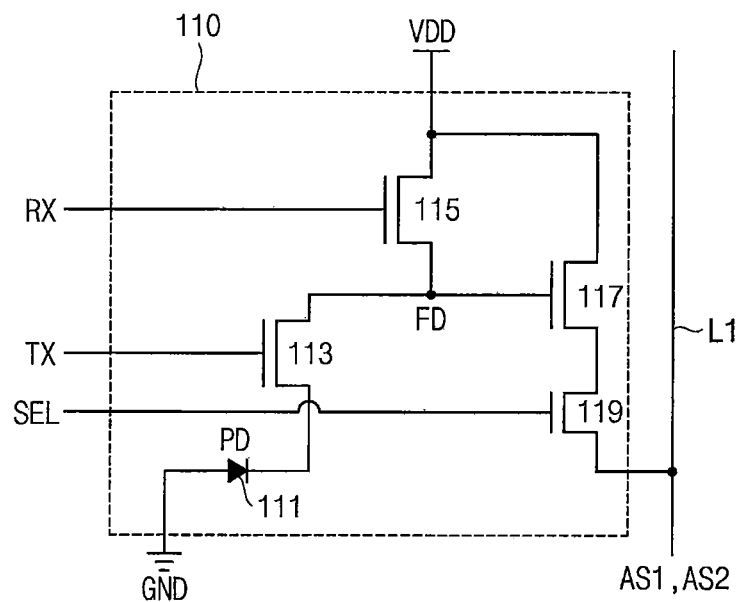
FIG. 9 is a circuit diagram illustrating an example of a pixel included in a pixel array of FIG. 10 according to some embodiments of the inventive concept.
Figure 10:
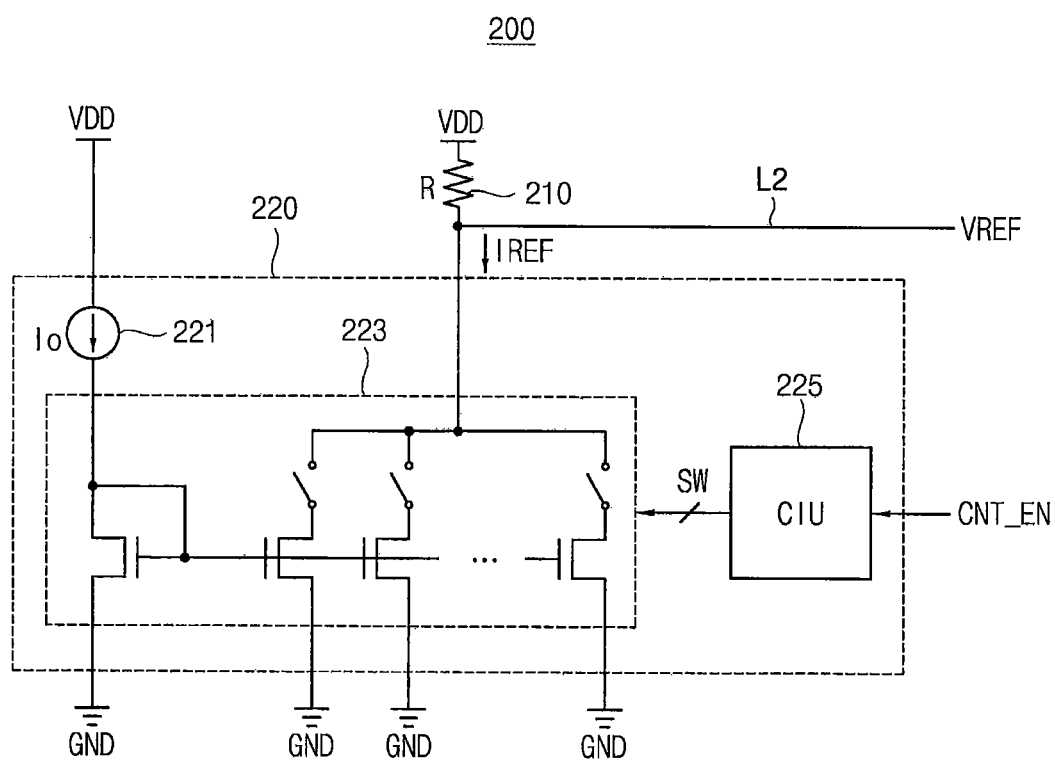
FIG. 10 is a block diagram illustrating an example of a reference signal generation circuit of FIG. 8 according to some embodiments of the inventive concept.

FIG. 9 is a circuit diagram illustrating an example of a pixel included in a pixel array of FIG. 10 according to some embodiments of the inventive concept.

Referring to FIG. 9, a pixel 110 may include a photoelectric conversion element PD 111, a transmission transistor 113, a reset transistor 115, a drive transistor 117, and a row selection transistor 119.

The photoelectric conversion element 111 may generate photo-charges in response to the incident light. In some example embodiments, the photoelectric conversion element 111 may include a photodiode.

The transmission transistor 113 may include a source storing the photo-charges generated by the photoelectric conversion element 111, a drain coupled to a floating diffusion region FD, and a gate receiving the transmission control signal TX.

The reset transistor 115 may include a source coupled to the floating diffusion region FD, a drain coupled to the supply voltage VDD, and a gate receiving the reset control signal RX.

The drive transistor 117 may include a source coupled to a drain of the row selection transistor 119, a drain coupled to the supply voltage VDD, and a gate coupled to the floating diffusion region FD.

The row selection transistor 119 may include a drain coupled to the source of the drive transistor 117, a gate receiving the row selection signal SEL, and a source outputting the first analog signal AS1 and the second analog signal AS2.

Hereinafter, an exemplary operation of the pixel array 100 will be described with reference to FIGS. 8 and 9.

The row driver 420 may select one of rows included in the pixel array 100 by providing an activated row selection signal SEL to the selected row of the pixel array 100 to turn on the row selection transistor 119. The row driver 420 may provide an activated reset control signal RX to the selected row to turn on the reset transistor 115. Therefore, a voltage of the floating diffusion region FD may become the supply voltage VDD, such that the drive transistor 117 may be turned on and the first analog signal AS1 corresponding to the reset component of the pixel 110 may be output from the pixel 110 through the first signal line L1.

The row driver 420 may then deactivate the reset control signal RX. When light is incident on the photoelectric conversion element 111, the photoelectric conversion element 111 may generate the photo-charges in a form of electron-hole pairs (EHPs). The EHPs generated by the photoelectric conversion element 111 may be accumulated at the source of the transmission transistor 113 such that a potential of the source of the transmission transistor 113 may change. The row driver 420 may provide an activated transmission control signal TX to the transmission transistor 113 to turn on the transmission transistor 113, and then electrons of the accumulated EHPs may be transferred to the floating diffusion region FD. The voltage of the floating diffusion region FD, which corresponds to a voltage of the gate of the drive transistor 117, may change in response to the number of electrons of the EHPs transferred to the floating diffusion region FD. If the row selection transistor 119 is turned on, the second analog signal AS2 corresponding to the voltage of the floating diffusion region FD may be output from the pixel 110 through the first signal line L1.

The row driver 420 may then activate the reset control signal RX again to turn on the reset transistor 115 such that the voltage of the floating diffusion region FD may become the supply voltage VDD.

The pixel array 100 and the row driver 420 may repeat the above described operations to generate the first analog signal AS1 and the second analog signal AS2 row by row.

The first analog signal AS1 and the second analog signal AS2 output from the pixel array 100 may have variations in a reset component for each pixel due to respective characteristics of each pixel referred to as a fixed pattern noise (FPN) and respective characteristics of each logic circuit for outputting the first analog signal AS1 and the second analog signal AS2 from a corresponding pixel. Accordingly, an effective intensity of incident light may be abstracted by subtracting the respective reset component from the detected intensity of incident light.

For this reason, each pixel included in the pixel array 100 may alternately generate the first analog signal AS1 corresponding to a respective reset component, and detect the intensity of incident light to generate the second analog signal AS2 corresponding to a respective detected intensity of incident light based on the row selection signal SEL, the reset control signal RX, and the transmission control signal TX. And then, the analog-to-digital conversion circuit 300 may generate the digital signal DS corresponding to an effective intensity of incident light among the detected incident light by performing a correlated double sampling (CDS) operation on the first analog signal AS1 and the second analog signal AS2.

Referring again to FIG. 8, the timing controller 410 may control the operation of the reference signal generation circuit 200 by providing a count enable signal CNT_EN to the reference signal generation circuit 200.

The reference signal generation circuit 200 may generate the reference signal VREF which decreases at the constant rate during an active period, in which the count enable signal CNT_EN is enabled.

FIG. 10 is a block diagram illustrating an example of a reference signal generation circuit of FIG. 8 according to some embodiments of the inventive concept.

Referring to FIG. 10, the reference signal generation circuit 200 may include a resistor R 210 and a current generation circuit 220.

The resistor 210 may be coupled between the supply voltage VDD and the current generation circuit 220.

The current generation circuit 220 may be coupled between the resistor 210 and the ground voltage GND. The current generation circuit 220 may generate a reference current IREF which increases at a constant rate during the active period, in which the count enable signal CNT_EN is enabled. The reference current IREF may flow from the resistor 210 to the ground voltage GND.

The current generation circuit 220 may include a static current source 221, a current amplification circuit 223, and a current control circuit CIU 225.

The static current source 221 may generate a static current Io having a constant magnitude.

The current control circuit 225 may generate an amplification control signal SW in response to the count enable signal CNT_EN.

The current amplification circuit 223 may amplify the static current Io in response to the amplification control signal SW received from the current control circuit 225 to generate the reference current IREF. As illustrated in FIG. 10, the current amplification circuit 223 may include a plurality of current mirrors each of which includes an NMOS transistor and a switch connected in series. Each switch included in each of the current mirrors may be controlled by the amplification control signal SW such that a magnitude of the reference current IREF may be adjusted.

The reference signal generation circuit 200 may output the reference signal VREF through the second signal line L2, which is coupled to a node at which the resistor 210 and the current amplification circuit 223 is coupled.

The reference signal VREF having a maximum magnitude may be generated when all switches included in the current mirrors are opened. The reference signal VREF may be decreased at the constant rate by closing the switches consecutively one by one during the active period, in which the count enable signal CNT_EN is enabled.

The reference signal generation circuit 200 of FIG. 10 is only an example of the reference signal generation circuit 200 included in the image sensor 50 of FIG. 8, and example embodiments are not limited thereto. According to example embodiments, the reference signal generation circuit 200 may be implemented in various structures.

Referring again to FIG. 8, the timing controller 410 may control the operation of the analog-to-digital conversion circuit 300 by providing a count clock signal CLKC and a switch control signal SWS to the analog-to-digital conversion circuit 300. According to example embodiments, the timing controller 410 may further provide an up-down control signal UD to the analog-to-digital conversion circuit 300.

The analog-to-digital conversion circuit 300 may alternately receive the first analog signal AS1 and the second analog signal AS2 from the pixel array 100 through the first signal line L1, and receive the reference signal VREF from the reference signal generation circuit 200 through the second signal line L2.

In some example embodiments, the analog-to-digital conversion circuit 300 may, based on the switch control signal SWS, disconnect a connection to the first signal line L1 during a transient period in which the pixel array 100 outputs the first analog signal AS1 through the first signal line L1 such that a voltage of the first signal line L1 changes, and connect to the first signal line L1 to receive the first analog signal AS1 through the first signal line L1 after the voltage of the first signal line L1 stabilizes at a voltage level corresponding to the first analog signal AS1. In addition, the analog-to-digital conversion circuit 300 may, based on the switch control signal SWS, disconnect a connection to the first signal line L1 during a transient period, in which the pixel array 100 outputs the second analog signal AS2 through the first signal line L1 such that a voltage of the first signal line L1 changes, and connect to the first signal line L1 to receive the second analog signal AS2 through the first signal line L1 after the voltage of the first signal line L1 stabilizes at a voltage level corresponding to the second analog signal AS2.

The analog-to-digital conversion circuit 300 may generate a first count value proportional to a magnitude of the first analog signal AS1 by comparing the first analog signal AS1 and the reference signal VREF, generate a second count value proportional to a magnitude of the second analog signal AS2 by comparing the second analog signal AS2 and the reference signal VREF, and output a difference between the first count value and the second count value as the digital signal DS.

The column driver 430 may consecutively output the digital signal DS received from the analog-to-digital conversion circuit 300 based on a second inner control signal ICON2 received from the timing controller 410. Although not illustrated in FIG. 8, the digital signal DS output by the column driver 430 may be provided to a digital signal processor.

Figure 11:
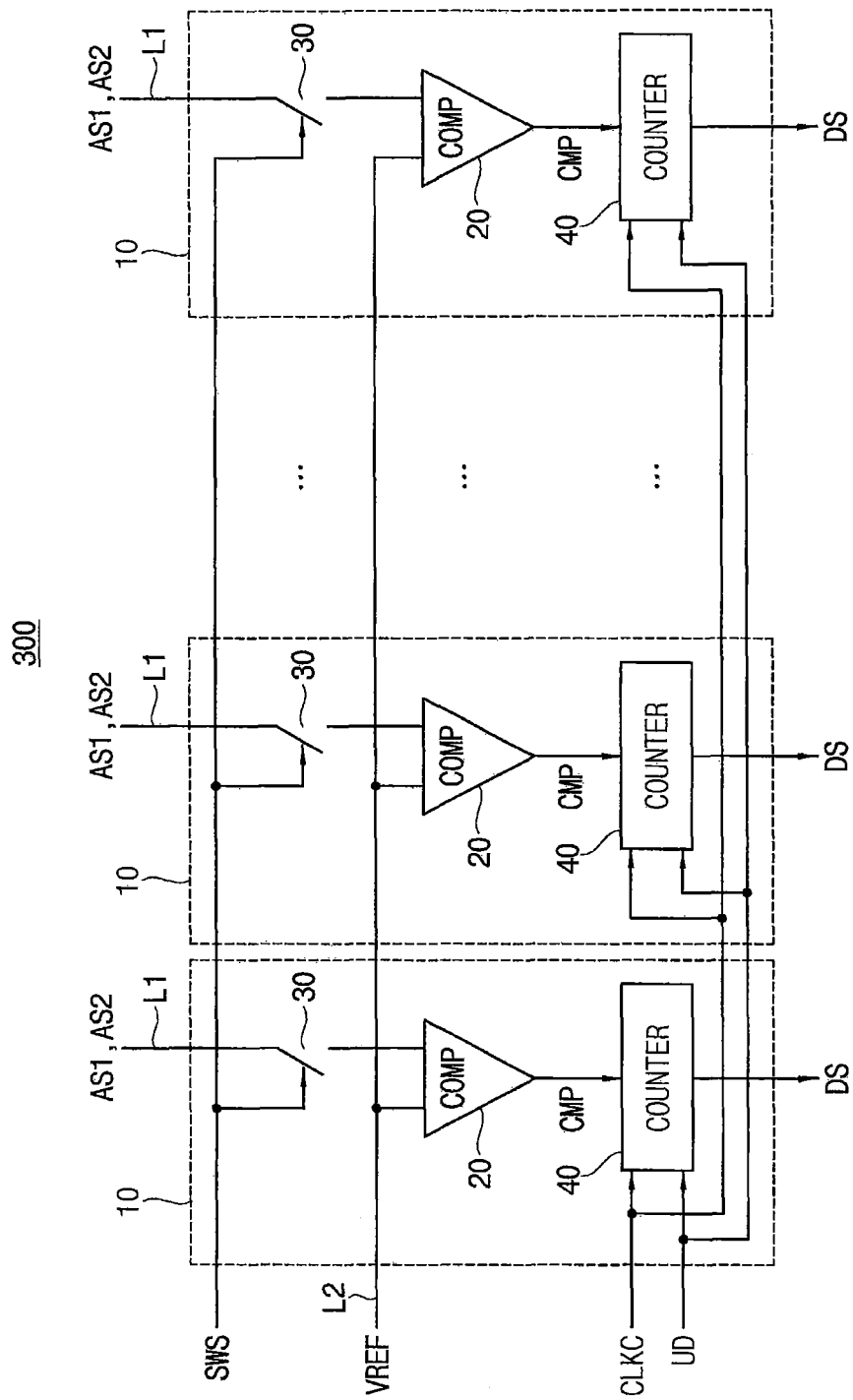
FIG. 11 is a block diagram illustrating an example of an analog-to-digital conversion circuit of FIG. 8 according to some embodiments of the inventive concept.

FIG. 11 is a block diagram illustrating an example of an analog-to-digital conversion circuit of FIG. 8 according to some embodiments of the inventive concept.

Referring to FIG. 11, the analog-to-digital conversion circuit 300 may include a plurality of analog-to-digital converters 10 each of which is coupled to a respective column of the pixel array 100 through the first signal line L1.

Each of the plurality of analog-to-digital converters 10 may alternately receive the first analog signal AS1 and the second analog signal AS2 from the pixel array 100 through the first signal line L1, and receive the reference signal VREF from the reference signal generation circuit 200 through the second signal line L2. In addition, each of the plurality of analog-to-digital converters 10 may receive the count clock signal CLKC and the switch control signal SWS from the control circuit 400.

Each of the plurality of analog-to-digital converters 10 may include a comparator COMP 20, a switch 30, and a counter circuit 40.

The comparator 20 may generate a comparison signal CMP by comparing the first analog signal AS1 and the second analog signal AS2 received through the first signal line L1 with the reference signal VREF received through the second analog signal L2.

The switch 30 may be coupled between the first signal line L1 and the comparator 20. The switch 30 may be closed in response to the switch control signal SWS. The switch 30 may be opened before each of the plurality of pixels 110 outputs the first analog signal AS1 through the first signal line L1, and be closed after each of the plurality of pixels 110 outputs the first analog signal AS1 through the first signal line L1. Similarly, the switch 30 may be opened before each of the plurality of pixels 110 outputs the second analog signal AS2 through the first signal line L1, and be closed after each of the plurality of pixels 110 outputs the second analog signal AS2 through the first signal line L1.

Each of the plurality of analog-to-digital converters 10 included in the analog-to-digital conversion circuit 300 of FIG. 11 may be implemented using the analog-to-digital converter 10 of FIG. 1.

Exemplary embodiments of the structure and operations of the analog-to-digital converter 10 of FIG. 1 are described above with reference to FIGS. 1 to 6. Therefore, a detailed description of the plurality of analog-to-digital converters 10 included in the analog-to-digital conversion circuit 300 will be omitted here.

Figure 12:
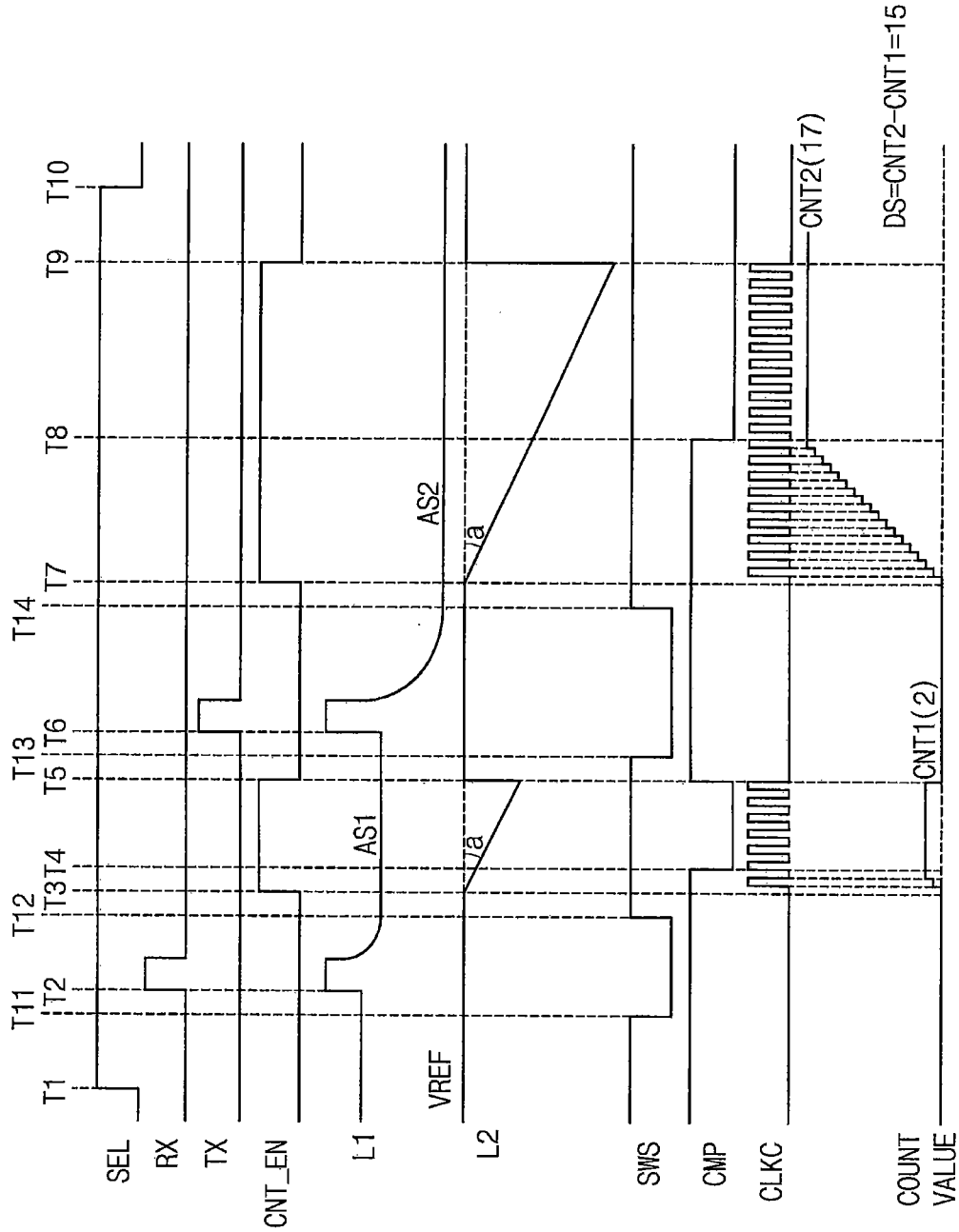
FIG. 12 is a timing diagram illustrating example operations of the image sensor of FIG. 8 according to some embodiments of the inventive concept.

FIG. 12 is a timing diagram illustrating an example of operations of the image sensor of FIG. 8 according to some embodiments of the inventive concept.

Hereinafter, an example of an operation of the image sensor 50 will be described with reference to FIGS. 1 to 12.

At a first time T1, the row driver 420 may select one of the rows included in the pixel array 100 by providing an activated row selection signal SEL to the selected row of the pixel array 100.

At an eleventh time T11, which is before the row driver 420 provides an activated reset control signal RX to the selected row at a second time T2, the row driver 420 may transition the switch control signal SWS to a logic low level. Therefore, the switch 30 may be opened, such that the comparator 20 may be disconnected from the first signal line L1.

At the second time T2, the row driver 420 may provide the activated reset control signal RX to the selected row. Referring to FIGS. 9 and 12, when the activated reset control signal RX is applied to the gate of the reset transistor 115, the voltage of the first signal line L1 may increase temporarily by a coupling effect and then stabilize at a voltage corresponding to a reset level, which is intrinsic to a respective pixel 110.

At a twelfth time T12, which is after the voltage of the first signal line L1 stabilizes at the voltage corresponding to the reset level, the row driver 420 may transition the switch control signal SWS to a logic high level. Therefore, the switch 30 may be closed, such that the voltage corresponding to the reset level may be provided to the comparator 20 through the first signal line L1 as the first analog signal AS1.

At a third time T3, the timing controller 410 may provide the count enable signal CNT_EN having a logic high level to the reference signal generation circuit 200, and the reference signal generation circuit 200 may start to decrease the reference signal VREF at the constant rate, that has a slope of 'a'. The comparator 20 may generate the comparison signal CMP having a logic high level because the voltage of the first analog signal AS1 is lower than the reference signal VREF. In addition, the timing controller 410 may provide the count clock signal CLKC to the counter circuit 40, and the counter circuit 40 may start to perform a count operation in synchronization with the count clock signal CLKC.

At a fourth time T4, a voltage level of the reference signal VREF may become equal to the voltage level of the first analog signal AS1, such that the comparator 20 may transition the comparison signal CMP to a logic low level. Therefore, the counter circuit 40 may stop performing the count operation at the fourth time T4 and generate the first count value CNT1 corresponding to the first analog signal AS1. FIG. 12 represents that the counter circuit 40 generates the first count value CNT1 having a value of "2" at the fourth time T4.

At a fifth time T5, the timing controller 410 may provide the count enable signal CNT_EN having a logic low level to the reference signal generation circuit 200, and the reference signal generation circuit 200 may return the voltage level of the reference signal VREF to a reference level. A time period from the third time T3 to the fifth time T5 may correspond to a maximum time for detecting the first analog signal AS1. A length of the time period from the third time T3 to the fifth time T5 may be determined according to a characteristic of the image sensor 50.

At a thirteenth time T13, which is before the row driver 420 provides an activated transmission control signal TX to the selected row at a sixth time T6, the row driver 420 may transition the switch control signal SWS to a logic low level. Therefore, the switch 30 may be turned off, such that the comparator 20 may be disconnected from the first signal line L1.

At the sixth time T6, the row driver 420 may provide the activated transmission control signal TX to the selected row. Referring to FIGS. 9 and 12, when the activated transmission control signal TX is applied to the gate of the transmission transistor 113, the voltage of the first signal line L1 may increase temporarily by a coupling effect and then stabilize at a voltage corresponding to the number of electrons of the EHPs transferred to the floating diffusion region FD.

At a fourteenth time T14, which is after the voltage of the first signal line L1 stabilizes at the voltage corresponding to the number of electrons of the EHPs transferred to the floating diffusion region FD, the row driver 420 may transition the switch control signal SWS to a logic high level. Therefore, the switch 30 may be turned on, such that the voltage corresponding to the number of electrons of the EHPs transferred to the floating diffusion region FD may be provided to the comparator 20 through the first signal line L1 as the second analog signal AS2.

At a seventh time T7, the timing controller 410 may provide the count enable signal CNT_EN having a logic high level to the reference signal generation circuit 200, and the reference signal generation circuit 200 may start to decrease the reference signal VREF at the constant rate, having a slope of 'a'. The comparator 20 may generate the comparison signal CMP having a logic high level because the voltage of the second analog signal AS2 is lower than the reference signal VREF. In addition, the timing controller 410 may provide the count clock signal CLKC to the counter circuit 40, and the counter circuit 40 may start to perform a count operation in synchronization with the count clock signal CLKC.

At an eighth time T8, a voltage level of the reference signal VREF may become equal to the voltage level of the second analog signal AS2, such that the comparator 20 may transition the comparison signal CMP to a logic low level. Therefore, the counter circuit 40 may stop performing the count operation at the eighth time T8 and generate the second count value CNT2 corresponding to the second analog signal AS2. FIG. 12 represents that the counter circuit 40 generates the second count value CNT2 having a value of "17" at the eighth time T8.

In some example embodiments, the counter circuit 40 may generate the digital signal DS corresponding to an effective intensity of the incident light by subtracting the first count value CNT1 from second count value CNT2.

At a ninth time T9, the timing controller 410 may provide the count enable signal CNT_EN having a logic low level to the reference signal generation circuit 200, and the reference signal generation circuit 200 may return the voltage level of the reference signal VREF to a reference level. A time period from the seventh time T7 to the ninth time T9 may correspond to a maximum time for detecting the second analog signal AS2. A length of the time period from the seventh time T7 to the ninth time T9 may be determined according to a characteristic of the image sensor 50.

At a tenth time T10, the row driver 420 may provide a deactivated row selection signal SEL to the selected row of the pixel array 100.

The image sensor 50 may repeat above described operations on each row to generate the digital signals DS row by row.

Figure 13:
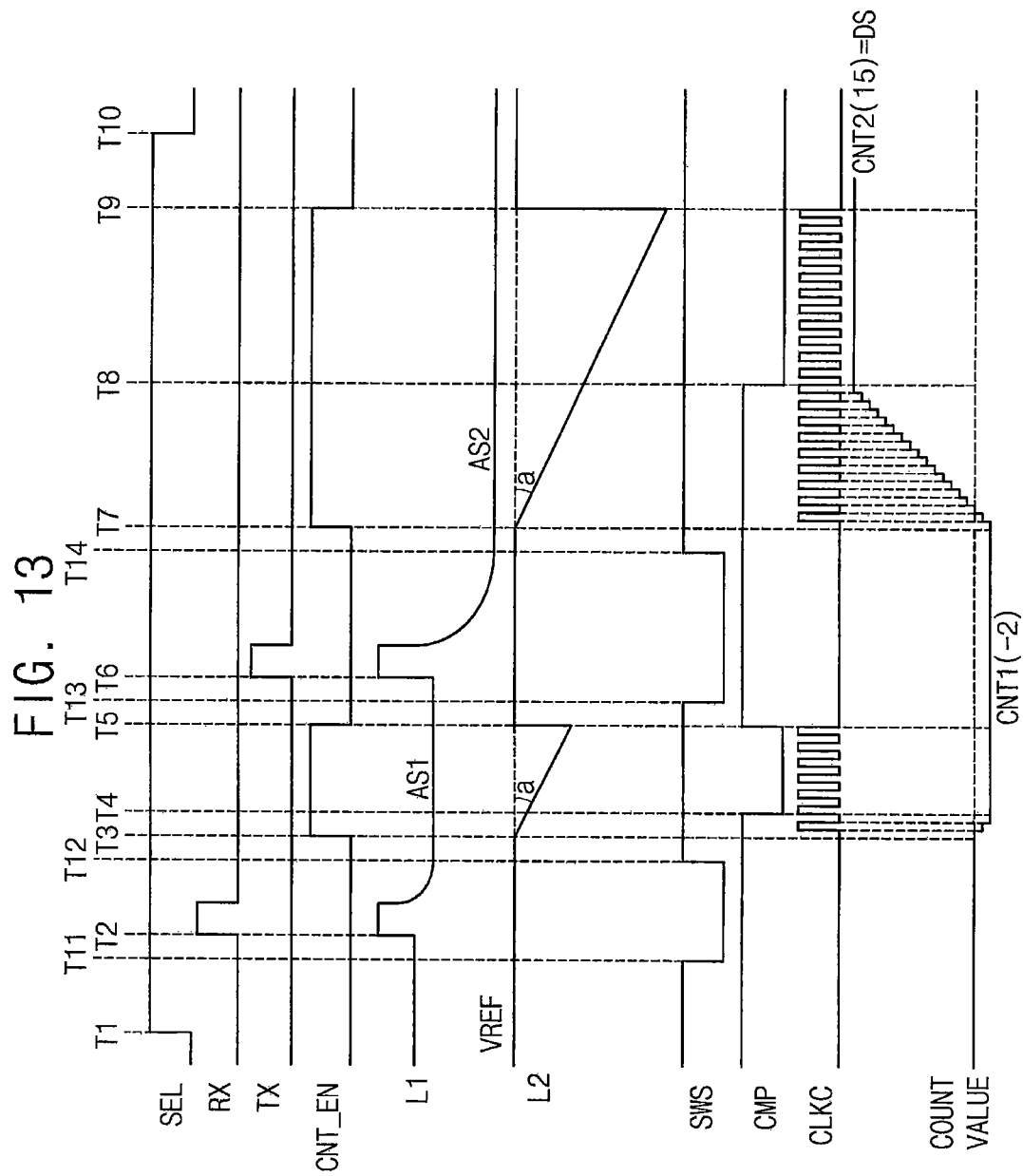
FIG. 13 is a timing diagram illustrating further example operations of the image sensor of FIG. 8 according to some embodiments of the inventive concept.

FIG. 13 is a timing diagram illustrating further example of operations of the image sensor of FIG. 8 according to some embodiments of the inventive concept.

The timing diagram of FIG. 13 is the same as a timing diagram of FIG. 12 except for operation of the counter circuit 40 included in the analog-to-digital converter 10. Therefore, duplicated description will be omitted and only the operation of the counter circuit 40 will be described.

In the timing diagram of FIG. 12, the counter circuit 40 generates the first count value CNT1 and the second count value CNT2 separately, and then outputs the difference between the first count value CNT1 and the second count value CNT2 as the digital signal DS.

On the other hand, in the timing diagram of FIG. 13, the counter circuit 40 may perform one of a down-count operation and an up-count operation in response to the up-down control signal UD received from the timing controller 410. For example, the counter circuit 40 may generate the first count value CNT1 by performing the down-count operation in response to the up-down control signal UD having a first logic level while the first analog signal AS1 is applied to the first signal line L1, and generate the second count value CNT2 by performing the up-count operation starting from the first count value CNT1 in response to the up-down control signal UD having a second logic level while the second analog signal AS2 is applied to the first signal line L1. In this case, the counter circuit 40 may output the second count value CNT2 as the digital signal DS after the counter circuit 40 stops performing the up-count operation at the eighth time T8.

As described above with reference to FIGS. 1 to 6, because the second transistor M2 included in the analog-to-digital converter 10 is maintained to be turned on while the analog-to-digital converter 10 performs the analog-to-digital conversion operation, RTS noise occurring in the second transistor M2 may decrease. Therefore, the analog-to-digital converter 10 may perform the CDS operation and the analog-to-digital conversion operation on the first analog signal AS1 and the second analog signal AS2 more accurately. As such, the image sensor 50 may provide image data of improved quality.

Figure 14:
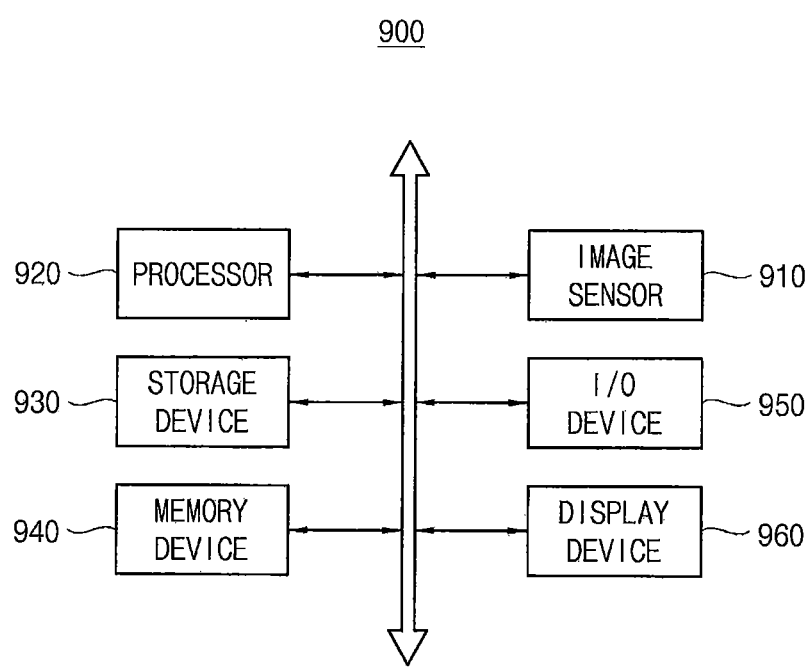
FIG. 14 is a block diagram illustrating a computing system according to some embodiments of the inventive concept.

FIG. 14 is a block diagram illustrating a computing system according to example embodiments of the inventive concept.

Referring to FIG. 14, a computing system 900 includes an image sensor 910, a processor 920, a storage device 930, a memory device 940, an input/output device 950, and a display device 960. Although not illustrated in FIG. 14, the computing system 900 may further include ports that communicate with a video card, a sound card, a memory card, a universal serial bus (USB) device, or other electronic devices.

The image sensor 910 may generate a digital signal in response to incident light. The display device 960 may display the digital signal. The storage device 930 may store the digital signal. The processor 920 may control operations of the image sensor 910, the display device 960, and the storage device 930.

The processor 920 may perform various calculations or tasks. According to some embodiments, the processor 920 may be a microprocessor or a CPU. The processor 920 may communicate with the storage device 930, the memory device 940 and the input/output device 950 via an address bus, a control bus, and/or a data bus. In some example embodiments, the processor 920 may be coupled to an extended bus, such as a peripheral component interconnection (PCI) bus.

The storage device 930 may include a non-volatile memory device, such as a flash memory device, a solid state drive (SSD), a hard disk drive (HDD), a compact disk read-only memory (CD-ROM) drive, etc.

The memory device 940 may store data required for operation of the computing system 900. The memory device 940 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 950 may include a touch screen, a keypad, a keyboard, a mouse, a printer, etc.

The image sensor 910 may be connected to the processor 920 through one or more of the above buses or other communication links to communicate with the processor 920.

The MOS transistor included in an analog-to-digital converter of the image sensor 910 may be maintained to be turned on while the analog-to-digital converter performs an analog-to-digital conversion operation. Therefore, RTS noise occurring in the MOS transistor may be decreased. As such, the image sensor 910 may provide image data of a high quality.

The image sensor 910 may be implemented with the image sensor 50 of FIG. 7. Exemplary structures and operations of the image sensor 50 of FIG. 7 are described above with reference to FIGS. 1 to 13. Therefore, a detailed description of the image sensor 910 will be omitted here.

The image sensor 910 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to example embodiments, the image sensor 910 may be integrated with the processor 920 in one chip, or the image sensor 910 and the processor 920 may be implemented as separate chips.

The computing system 900 may be any computing system using an image sensor. For example, the computing system 900 may include a digital camera, a mobile phone, a smart phone, a portable multimedia player (PMP), a personal digital assistant (PDA), etc.

Figure 15:
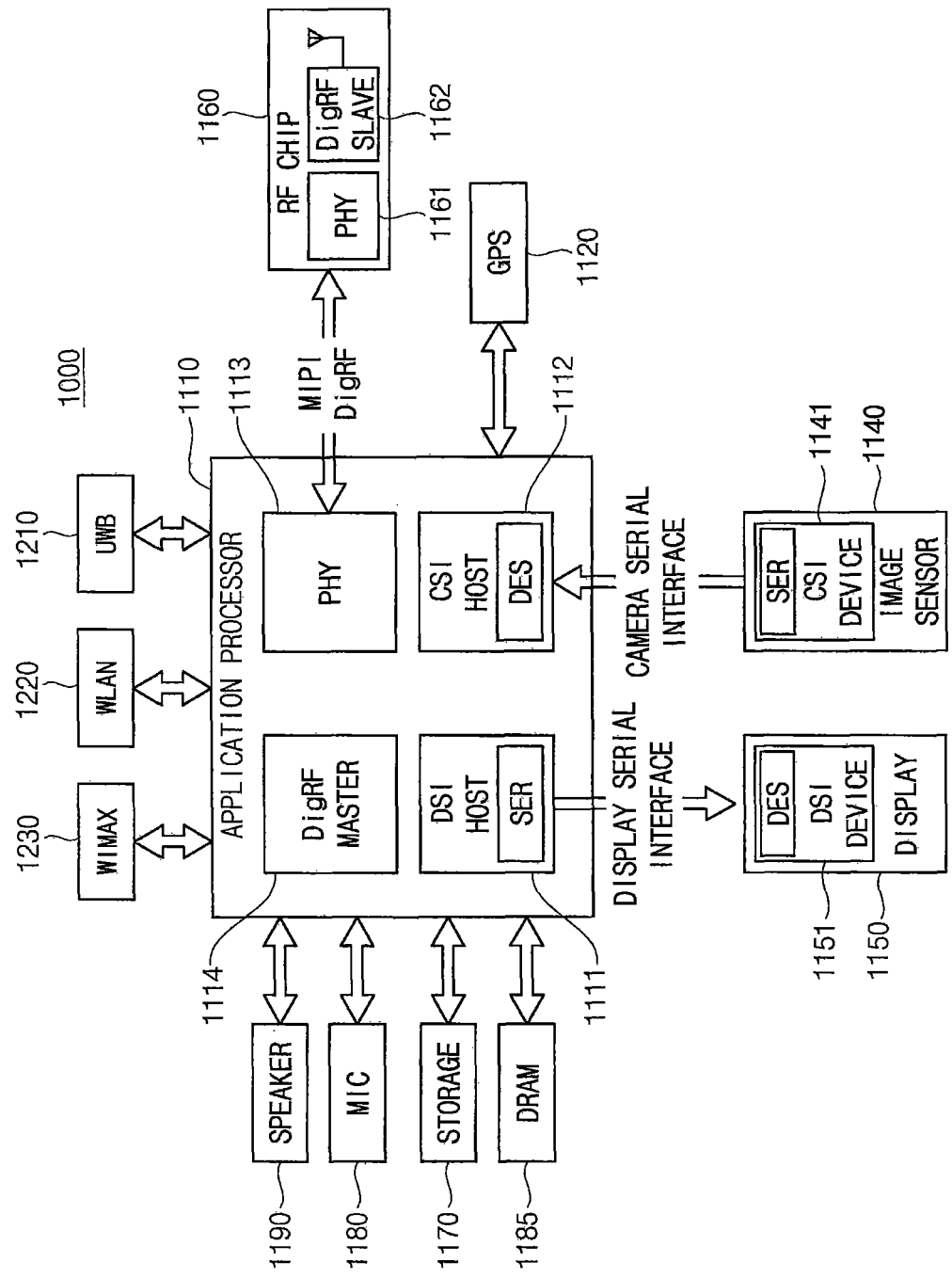
FIG. 15 is a block diagram illustrating an example of an interface used in the computing system of FIG. 14 according to some embodiments of the inventive concept.

FIG. 15 is a block diagram illustrating an example of an interface used in the computing system of FIG. 14.

Referring to FIG. 15, a computing system 1000 may be implemented by a data processing device (e.g., a cellular phone, a personal digital assistant, a portable multimedia player, a smart phone, etc.) that uses or supports a mobile industry processor interface (MIPI) interface. The computing system 1000 may include an application processor 1110, an image sensor 1140, a display device 1150, etc.

A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI). In some example embodiments, the DSI host 1111 may include a serializer (SER), and the DSI device 1151 may include a deserializer (DES).

The computing system 1000 may further include a radio frequency (RF) chip 1160 performing communication with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications according to the MIPI DigRF of the PHY 1161, and the RF chip 1160 may further include a DigRF SLAVE 1162 controlled by the DigRF MASTER 1114.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1210, a wireless local area network (WLAN) 1220, a worldwide interoperability for microwave access (WIMAX) 1230, etc. However, the structure and the interface of the computing system 1000 are not limited thereto.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An analog-to-digital converter, comprising:
   a comparator configured to generate a comparison signal by comparing an analog signal received through a first signal line and a reference signal received through a second signal line;
   a switch coupled between the first signal line and the comparator, the switch being open before the analog signal is applied to the first signal line to disconnect the first signal line from the comparator, the switch being closed after the analog signal is applied to the first signal line to provide the analog signal to the comparator; and
   a counter circuit configured to generate a digital signal corresponding to the analog signal by performing a count operation in synchronization with a count clock signal based on the comparison signal.

2. The analog-to-digital converter of claim 1, wherein the switch is open during a transient period in which the analog signal is applied to the first signal line such that a voltage of the first signal line is changed, and is closed after the voltage of the first signal line is stabilized at a voltage corresponding to the analog signal.

3. The analog-to-digital converter of claim 1, wherein the comparator comprises:
   a first coupling capacitor comprising a first electrode coupled to the switch;
   a first transistor comprising a gate coupled to a second electrode of the first coupling capacitor;
   a second coupling capacitor comprising a first electrode coupled to the second signal line; and
   a second transistor comprising a gate coupled to a second electrode of the second coupling capacitor, and wherein the comparator is configured to output the comparison signal through a drain of the first transistor based on a magnitude of a current flowing through the first transistor and a magnitude of a current flowing through the second transistor.

4. The analog-to-digital converter of claim 3, wherein an aspect ratio of the first transistor is substantially the same as an aspect ratio of the second transistor.

5. The analog-to-digital converter of claim 3, wherein the second transistor is maintained to be turned on from a time before the analog signal is applied to the first signal line to a time at which the counter circuit outputs the digital signal.

6. The analog-to-digital converter of claim 3, wherein the comparator further comprises:
 a current source coupled between a ground voltage and sources of the first transistor and the second transistor;
 a third transistor coupled between the drain of the first transistor and a supply voltage, the third transistor comprising a gate coupled to a drain of the second transistor; and
 a fourth transistor coupled between the drain of the second transistor and the supply voltage, the fourth transistor comprising a gate coupled to the drain of the second transistor.

7. The analog-to-digital converter of claim 1, wherein the reference signal is maintained at a reference level before the switch is closed, and decreases at a constant rate after the switch is closed.

8. The analog-to-digital converter of claim 1, wherein a first analog signal and a second analog signal are applied to the first signal line alternately,
 wherein the switch is open before the first analog signal is applied to the first signal line to disconnect the first signal line from the comparator and is closed after the first analog signal is applied to the first signal line to provide the first analog signal to the comparator, the comparator is configured to generate a first comparison signal by comparing the first analog signal and the reference signal, and the counter circuit is configured to generate a first count value corresponding to the first analog signal by performing a count operation in synchronization with the count clock signal until a logic level of the first comparison signal is changed, and
 wherein the switch is open before the second analog signal is applied to the first signal line to disconnect the first signal line from the comparator and is closed after the second analog signal is applied to the first signal line to provide the second analog signal to the comparator, the comparator is configured to generate a second comparison signal by comparing the second analog signal and the reference signal, and the counter circuit is configured to generate a second count value corresponding to the second analog signal by performing a count operation in synchronization with the count clock signal until a logic level of the second comparison signal is changed and outputs a difference between the first count value and the second count value as the digital signal.

9. An image sensor, comprising:
 a pixel array including a plurality of pixels, each of the plurality of pixels generating an analog signal in response to incident light;
 a reference signal generation circuit configured to generate a reference signal changing at a constant rate; and
 an analog-to-digital converter configured to generate a digital signal corresponding to the analog signal, the analog-to-digital converter comprising:
  a comparator configured to generate a comparison signal by comparing the analog signal and the reference signal;
  a switch coupled between the pixel array and the comparator, the switch being open before the pixel array outputs the analog signal to disconnect the pixel array from the comparator, the switch being closed after the pixel array outputs the analog signal to provide the analog signal to the comparator; and
  a counter circuit configured to generate the digital signal by performing a count operation in synchronization with a count clock signal based on the comparison signal.

10. The image sensor of claim 9, wherein each of the plurality of pixels alternately generates a first analog signal corresponding to a reset component and a second analog signal corresponding to the incident light,
 wherein the switch is open before each of the plurality of pixels outputs the first analog signal and is closed after each of the plurality of pixels outputs the first analog signal, and
 wherein the switch is open before each of the plurality of pixels outputs the second analog signal and is closed after each of the plurality of pixels outputs the second analog signal.

11. The image sensor of claim 9, wherein each of the plurality of pixels comprises:
 a photoelectric conversion element configured to generate photo-charges in response to the incident light;
 a transmission transistor comprising a source storing the photo-charges generated by the photoelectric conversion element, a drain coupled to a floating diffusion region, and a gate configured to receive a transmission control signal;
 a reset transistor comprising a source coupled to the floating diffusion region, a drain coupled to a supply voltage, and a gate configured to receive a reset control signal;
 a drive transistor comprising a source, a drain coupled to the supply voltage, and a gate coupled to the floating diffusion region; and
 a row selection transistor comprising a drain coupled to the source of the drive transistor, a gate configured to receive a row selection signal, and a source configured to output the analog signal.

12. The image sensor of claim 11, wherein the switch is open during a first time period including a second time period in which the reset control signal is activated, and is closed after the first time period, and
 wherein the switch is open during a third time period including a fourth time period in which the transmission control signal is activated, and is closed after the third time period.

13. The image sensor of claim 12, wherein the reference signal is maintained at a reference level while the switch is open, and decreases at a constant rate from the reference level after the switch is closed.

14. The image sensor of claim 9, wherein the comparator comprises:
 a first coupling capacitor comprising a first electrode coupled to the switch;
 a first transistor comprising a gate coupled to a second electrode of the first coupling capacitor;
 a second coupling capacitor comprising a first electrode configured to receive the reference signal; and
 a second transistor comprising a gate coupled to a second electrode of the second coupling capacitor, and wherein the comparator is configured to output the comparison signal through a drain of the first transistor based on a magnitude of a current flowing through the first transistor and a magnitude of a current flowing through the second transistor.

15. The image sensor of claim 14, wherein the second transistor is maintained to be turned on from a time before each of the plurality of pixels outputs the analog signal to a time at which the counter circuit outputs the digital signal.

16. An analog-to-digital converter, comprising:
a comparator circuit comprising a differential pair of transistors, a first one of the pair of transistors being coupled to a reference signal and a second one of the pair of transistors being coupled to an input analog signal via a switch, the switch being configured in an open state to disconnect the input analog signal from the second one of the pair of transistors responsive to receiving the input analog signal and being configured in a closed state to connect the input analog signal to the second one of the pair of transistors responsive to a transient time period having elapsed after receiving the input analog signal at the switch, the comparator circuit being configured to generate an output signal based on the input analog signal and the reference signal; and a counter circuit that is configured to generate a digital signal responsive to the output signal of the comparator circuit.

17. The analog-to-digital converter of claim 16, wherein the input analog signal has a substantially constant magnitude after the transient time period has elapsed.

18. The analog-to-digital converter of claim 17, wherein a magnitude of the reference signal is changed at a known rate beginning at a start count time responsive to the switch being configured in the closed state; and
wherein the output signal of the comparator circuit transitions from a first logic state to a second logic state at a stop count time responsive to the magnitude of the reference signal and the magnitude of the input analog signal are approximately equal.

19. The analog-to-digital converter of claim 18, wherein the counter circuit is configured to generate the digital signal based on a time difference between the stop count time and the start count time.

20. The analog-to-digital converter of claim 16, wherein the first one of the pair of transistors is maintained in an on state during the transient time period.

* * * * *